United States Patent
Yu et al.

(10) Patent No.: US 10,553,569 B2
(45) Date of Patent: Feb. 4, 2020

(54) MULTI-DIE STRUCTURE AND METHOD FOR FORMING SAME

(71) Applicant: Taiwan Semiconductor Manufacturing Company, Ltd., Hsinchu (TW)

(72) Inventors: Chen-Hua Yu, Hsinchu (TW); Po-Hao Tsai, Zhongli (TW); Jing-Cheng Lin, Hsinchu (TW); Li-Hui Cheng, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 11 days.

(21) Appl. No.: 15/699,373

(22) Filed: Sep. 8, 2017

(65) Prior Publication Data

US 2017/0373048 A1    Dec. 28, 2017

Related U.S. Application Data

(62) Division of application No. 15/097,445, filed on Apr. 13, 2016, now Pat. No. 9,761,566.

(51) Int. Cl.
*H01L 23/48* (2006.01)
*H01L 25/10* (2006.01)
(Continued)

(52) U.S. Cl.
CPC .......... *H01L 25/105* (2013.01); *H01L 21/565* (2013.01); *H01L 21/6835* (2013.01); *H01L 23/3128* (2013.01); *H01L 23/552* (2013.01); *H01L 24/11* (2013.01); *H01L 24/14* (2013.01); *H01L 25/50* (2013.01); *H01L 21/561* (2013.01); *H01L 21/568* (2013.01); *H01L 2221/68313* (2013.01); *H01L 2221/68345* (2013.01); *H01L 2221/68359* (2013.01);
(Continued)

(58) Field of Classification Search
CPC . H01L 21/565; H01L 21/6835; H01L 25/105; H01L 25/50; H01L 23/552; H01L 23/3128; H01L 2224/13009; H01L 2225/1058
See application file for complete search history.

(56) References Cited

U.S. PATENT DOCUMENTS

| | | | | |
|---|---|---|---|---|
| 5,838,551 A | * | 11/1998 | Chan | H01L 23/552 361/818 |
| 7,687,895 B2 | * | 3/2010 | Brunnbauer | H01L 21/561 257/685 |

(Continued)

*Primary Examiner* — Hoa B Trinh
(74) *Attorney, Agent, or Firm* — Slater Matsil, LLP

(57) ABSTRACT

A device includes a semiconductor structure comprising a top package stacked on a bottom package, wherein the bottom package comprises a plurality of bottom package bumps on a bottom surface of the bottom package, a front side contact metal, a molding compound layer and a backside contact metal, and wherein the front side contact metal is between the plurality of bottom package bumps and the molding compound layer and a metal shielding layer on a top surface, sidewalls of the semiconductor structure and portions of a bottom surface of the bottom package, wherein the metal shielding layer is in direct contact with an edge of at least one of the front side contact metal and the backside contact metal.

20 Claims, 39 Drawing Sheets

(51) Int. Cl.
*H01L 21/56* (2006.01)
*H01L 21/683* (2006.01)
*H01L 23/31* (2006.01)
*H01L 23/552* (2006.01)
*H01L 23/00* (2006.01)
*H01L 25/00* (2006.01)

(52) U.S. Cl.
CPC ............... *H01L 2221/68381* (2013.01); *H01L 2224/13009* (2013.01); *H01L 2224/18* (2013.01); *H01L 2225/1035* (2013.01); *H01L 2225/1041* (2013.01); *H01L 2225/1058* (2013.01)

(56) References Cited

U.S. PATENT DOCUMENTS

| | | | | |
|---|---|---|---|---|
| 8,378,383 B2* | 2/2013 | Pagaila | ................. | H01L 21/568 257/125 |
| 8,710,640 B2* | 4/2014 | Choi | ................. | H01L 23/36 257/686 |
| 8,829,667 B2* | 9/2014 | Park | ................. | H01L 23/552 257/692 |
| 9,123,663 B2* | 9/2015 | Kim | ................. | H01L 21/561 |
| 9,754,897 B2* | 9/2017 | Lin | ................. | H01L 23/552 |
| 2006/0145361 A1* | 7/2006 | Yang | ................. | H01L 23/29 257/787 |
| 2007/0145539 A1* | 6/2007 | Lam | ................. | H01L 21/561 257/659 |
| 2011/0233736 A1* | 9/2011 | Park | ................. | H01L 25/105 257/659 |
| 2016/0176701 A1 | 6/2016 | Gupta et al. | | |
| 2018/0151540 A1* | 5/2018 | Yu | ................. | H01L 21/561 |
| 2018/0323170 A1* | 11/2018 | Kim | ................. | H01L 25/50 |

* cited by examiner

MULTI-DIE STRUCTURE AND METHOD FOR FORMING SAME

CROSS-REFERENCE TO RELATED APPLICATIONS

This application is a divisional of U.S. application Ser. No. 15/097,445, filed on Apr. 13, 2016, which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for miniaturization, higher speed and greater bandwidth, as well as lower power consumption and latency has grown recently, there has grown a need for smaller and more creative packaging techniques of semiconductor dies.

As semiconductor technologies further advance, package-on-package semiconductor devices have emerged as an effective alternative to further reduce the physical size of a semiconductor device. In a package-on-package semiconductor device, active circuits such as logic, memory, processor circuits and the like are fabricated on different wafers and packages. Two or more packages are installed on top of one another, i.e. stacked, with a standard interface to route signals between them. Much higher density can be achieved by employing package-on-package semiconductor devices. Furthermore, package-on-package semiconductor devices can achieve smaller form factors, cost-effectiveness, increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
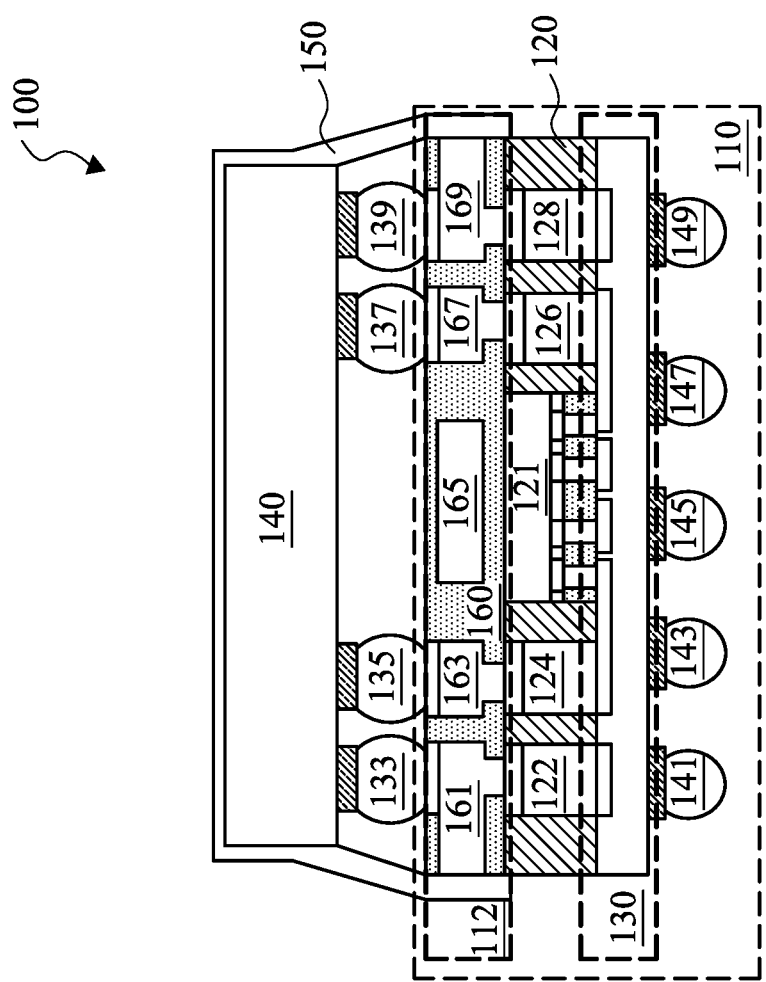
FIG. 1 illustrates a cross sectional view of a package-on-package semiconductor device in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, a package-on-package structure having a metal shielding layer. The embodiments of the disclosure may also be applied, however, to a variety of semiconductor structures comprising a semiconductor die surrounded by a molding material. The semiconductor structures may be multi-die stacking chips, multi-dies on a substrate and the like. Hereinafter, various embodiments will be explained in detail with reference to the accompanying drawings.

FIG. 1 illustrates a cross sectional view of a package-on-package semiconductor device in accordance with various embodiments of the present disclosure. The package-on-package semiconductor device 100 includes a bottom package 110 and a top package 140. In particular, the top package 140 is stacked on top of the bottom package 110. In addition, the top package 140 and the bottom package 110 are bonded together through a joint structure formed by top package bumps 133, 135, 137 and 139, and their respective solder layers on the bottom package 110. As shown in FIG. 1, the joint structure includes four solder covered bumps, which are generated by a reflow process. The reflow process will be described below with respect to FIG. 22.

The bottom package 110 comprises a plurality of bumps 141, 143, 145, 147 and 149, a first interconnect structure 130, a molding compound layer 120 and a second interconnect structure 112. Throughout the description, the first interconnect structure 130 is alternatively referred to as a front side interconnect structure 130. Likewise, the second interconnect structure 112 is alternatively referred to as a backside interconnect structure 112.

As shown in FIG. 1, the molding compound layer 120 is between the front side interconnect structure 130 and the backside interconnect structure 112. Furthermore, a semiconductor die 121 is embedded in the molding compound layer 120. As shown in FIG. 1, a substrate side of the semiconductor die 121 is in direct contact with the backside interconnect structure 112. An interconnect side of the semiconductor die 121 is in direct contact with the front side interconnect structure 130.

A plurality of through vias 122, 124, 126 and 128 are embedded in the molding compound layer 120. As shown in FIG. 1, a bottom surface of each through via (e.g., through via 122) is connected to the front side interconnect structure 130. A top surface of each through via (e.g., through via 122) is connected to the backside interconnect structure 112. In some embodiments, as shown in FIG. 1, there may be a seed layer between the top surfaces of the through vias and the backside interconnect structure 112. Alternatively, the top surfaces of the through vias are in direct contact with the backside interconnect structure 112. The through vias 122, 124, 126 and 128 are formed of suitable conductive materials such as copper, copper alloys, tin alloys and the like.

A plurality of bottom package bumps 141, 143, 145, 147 and 149 are formed over the front side interconnect structure 130 of the bottom package 110. In some embodiments, the bottom package bumps 141, 143, 145, 147 and 149 are solder balls. There may be a plurality of under bump metallization (UBM) structures formed underneath their respective bottom package bumps. The detailed formation processes of the bottom package bumps 141, 143, 145, 147 and 149 and their respective UBM structures will be described below with respect to FIG. 17.

It should be noted that the numbers of bottom package bumps (e.g., bumps 141-149), top package bumps (e.g., bumps 133-139), through vias (e.g., through vias 122-128), the number of layers of the backside interconnect structure 112 and the number of layers of the front side interconnect structure 130 shown in FIG. 1 are merely examples. A person skilled in the art would recognize many variations, alternatives, and modifications. For example, the bottom package 110 could accommodate any number of through vias.

The package-on-package semiconductor device 100 further comprises a metal shielding layer 150. The metal shielding layer 150 may be formed of suitable conductive materials such as stainless steel, iron alloys, copper, nickel, titanium, titanium-tungsten, silver, silver alloys, any combinations thereof and the like.

As shown in FIG. 1, the metal shield layer 150 covers the top surface of the top package 140, sidewalls of the top package 140 and portions of the bottom package 110. As shown in FIG. 1, the lower edge of the metal shielding layer is level with the top surface of the molding compound layer 120 according to an embodiment.

The backside interconnect structure 112 includes a plurality of redistribution lines 161, 163, 165, 167 and 169. As shown in FIG. 1, the redistribution lines 161, 163, 165, 167 and 169 are embedded in a dielectric layer 160. In some embodiments, the redistribution lines (e.g., redistribution layer 161) may be connected to the through vias (e.g., through via 122) through an interconnect via.

It should be noted that the structure of the backside interconnect structure 112 shown in FIG. 1 is merely an example. A person skilled in the art would recognize many variations, alternatives, and modifications. For example, the backside interconnect structure 112 could accommodate any number of metallization layers. Furthermore, the redistribution lines 161, 163, 167 and 169 may be connected to their respective through vias 122, 124, 126 and 128 directly.

As shown in FIG. 1, the redistribution lines 161 and 169 are covered by the dielectric layer 160 except that the surfaces of the sidewalls of the redistribution lines 161 and 169 are exposed outside the dielectric layer 160. More particularly, the leftmost edge of the redistribution line 161 is directly connected to the metal shielding layer 150. Likewise, the rightmost edge of the redistribution line 169 is directly connected to the metal shielding layer 150. In other words, the exposed edges of the redistribution lines 161 and 169 function as shielding layer contacts for the package-on-package semiconductor device 100. In some embodiments, after the package-on-package semiconductor device 100 has been mounted on a printed circuit board (PCB), the redistribution lines (e.g., redistribution line 169) is connected to the ground potential of the PCB board through the interconnect vias, the through vias (e.g., through via 128), the front side interconnect structure 130 and the bottom package bumps (e.g., bottom package bump 149).

It should be noted that the redistribution lines 161 and 169 shown in FIG. 1 is merely an example. A person skilled in the art would recognize many variations, alternatives, and modifications. For example, the front side redistribution lines may be shielding layer contacts. Furthermore, any exposed contact metals of the semiconductor device 100 may function as shielding layer contacts.

Figure 1A:
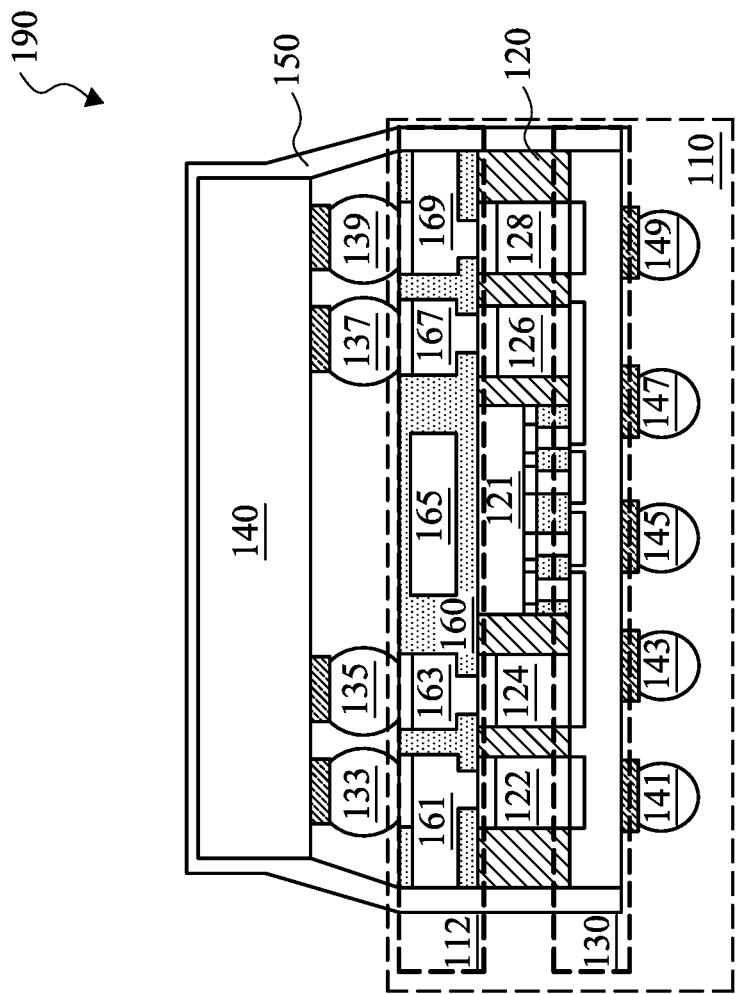
FIG. 1(A) illustrates a cross sectional view of another package-on-package semiconductor device in accordance with various embodiments of the present disclosure.

FIG. 1(A) illustrates a cross sectional view of yet another package-on-package semiconductor device in accordance with various embodiments of the present disclosure. The package-on-package semiconductor device 190 is similar to the package-on-package semiconductor device 100 shown in FIG. 1 except that the lower end of the shielding layer is level with the surface of the front side interconnect structure 130 as shown in FIG. 1(A). A person skilled in the art would understand the variation shown in FIG. 1(A) can be achieved by slightly modifying the fabrication process.

Figure 2:
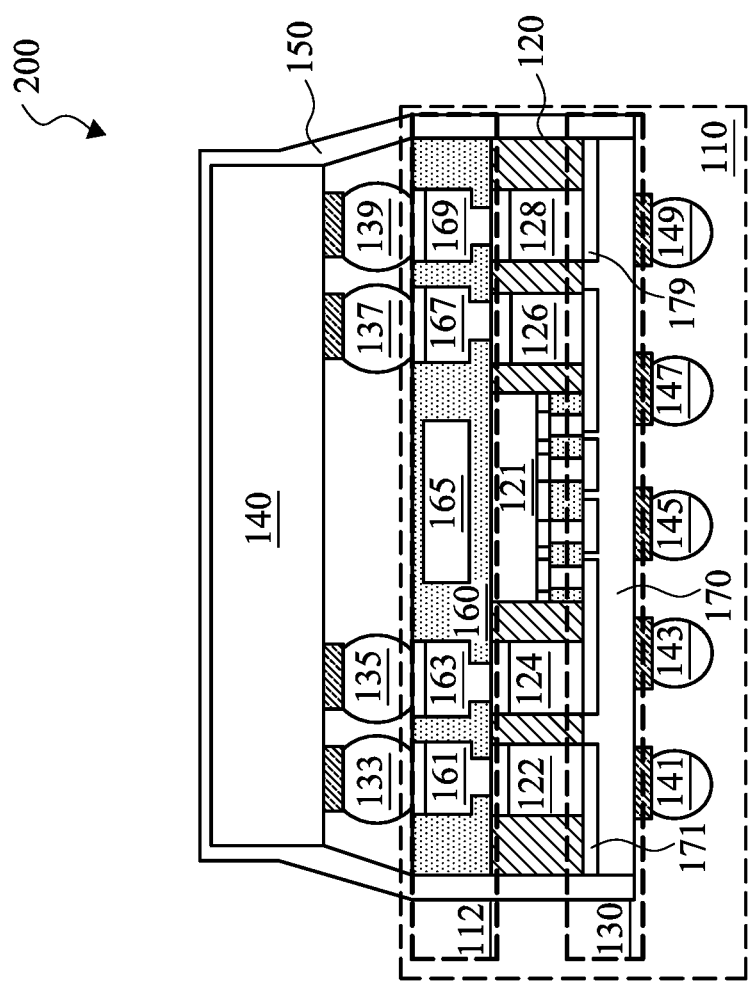
FIG. 2 illustrates a cross sectional view of another package-on-package semiconductor device in accordance with various embodiments of the present disclosure.

FIG. 2 illustrates a cross sectional view of another package-on-package semiconductor device in accordance with various embodiments of the present disclosure. The package-on-package semiconductor device 200 is similar to the package-on-package semiconductor device 100 shown in FIG. 1 except that the front side redistribution lines 171 and 179 may function as shielding layer contacts. More particularly, the front side interconnect structure 130 may comprise a plurality of front side redistribution lines embedded in a dielectric layer 170. The leftmost edge of the redistribution line 171 is directly connected to the metal shielding layer 150. Likewise, the rightmost edge of the redistribution line 179 is directly connected to the metal shielding layer 150. In some embodiments, after the package-on-package semiconductor device 200 has been mounted on a PCB board, the redistribution lines (e.g., redistribution line 179) is connected to the ground potential of the PCB board through the interconnect vias (not shown) and the bottom package bumps (e.g., bottom package bump 149).

It should be noted that the structure of the front side interconnect structure 130 shown in FIG. 2 is merely an example. A person skilled in the art would recognize many variations, alternatives, and modifications. For example, the front side interconnect structure 130 may comprise a variety of other suitable interconnect elements such as vias.

Figure 3:
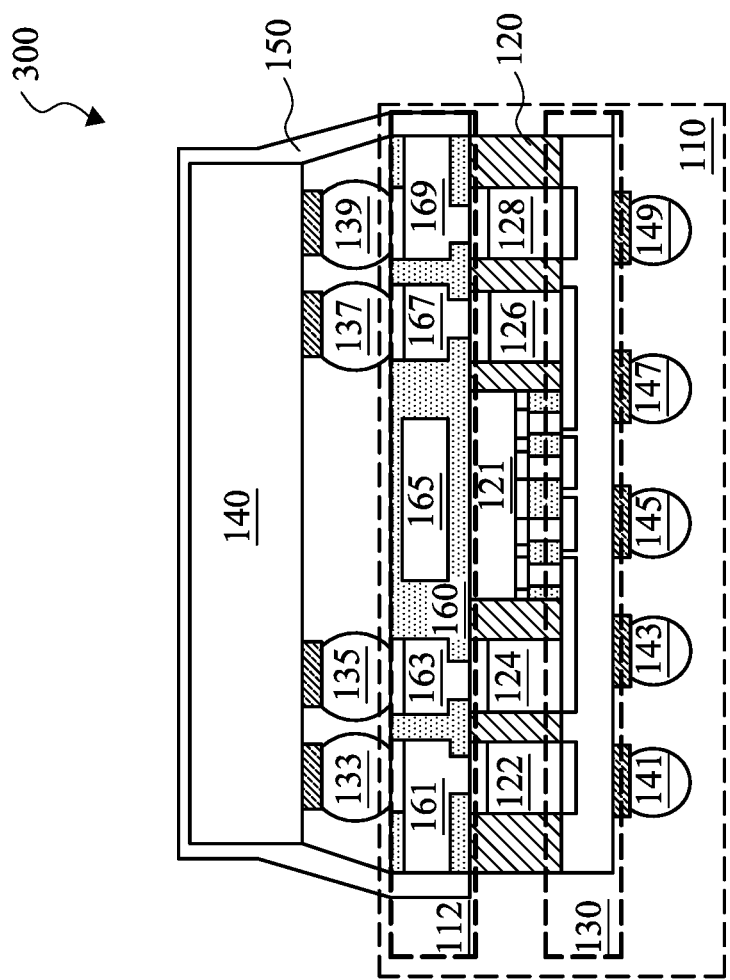
FIG. 3 illustrates a cross sectional view of yet another package-on-package semiconductor device in accordance with various embodiments of the present disclosure.

FIG. 3 illustrates a cross sectional view of yet another package-on-package semiconductor device in accordance with various embodiments of the present disclosure. The package-on-package semiconductor device 300 is similar to the package-on-package semiconductor device 100 shown in FIG. 1 except that the metal shielding layer 150 is in direct contact with both the edge and top surface of the backside redistribution line. As shown in FIG. 3, a portion of the dielectric layer 160 over the redistribution layer 161 has been removed. As a result, the metal shielding layer 150 is in direct contact with the top surface of the redistribution line 161. Likewise, the metal shielding layer 150 is in direct contact with the top surface of the redistribution line 169.

One advantageous feature of having the metal shielding layer 150 in direct contact with the top surface of the redistribution line is the contact between the metal shielding layer and the top surface of the redistribution line helps to achieve a reliable grounding connection.

Figure 3A:
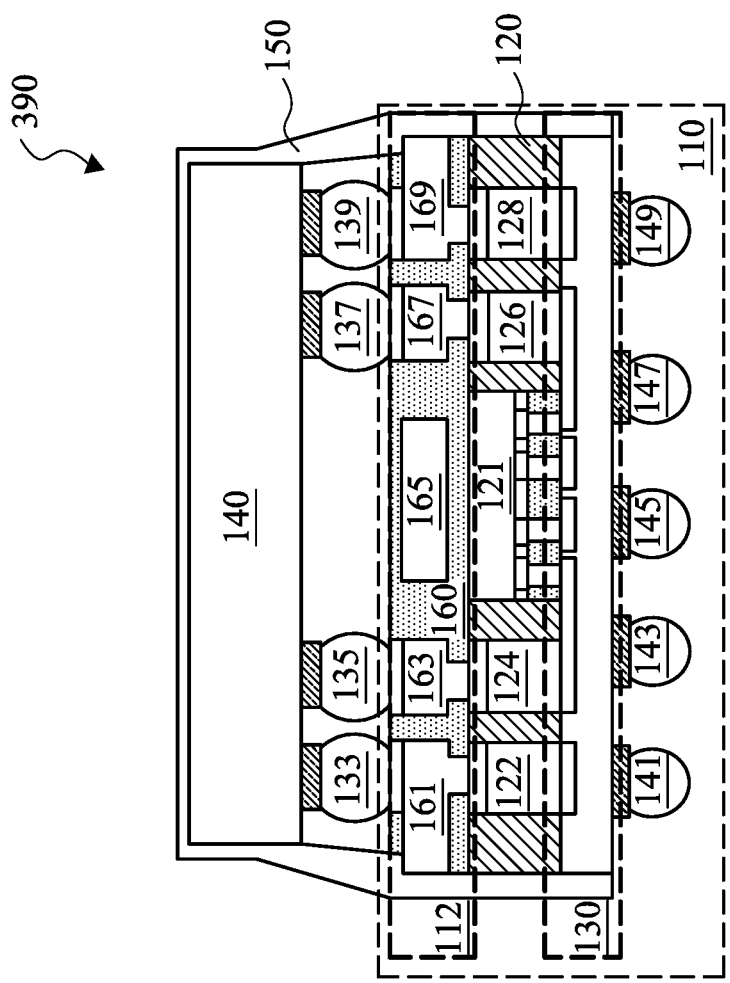
FIG. 3(A) illustrates a cross sectional view of yet another package-on-package semiconductor device in accordance with various embodiments of the present disclosure.

FIG. 3(A) illustrates a cross sectional view of yet another package-on-package semiconductor device in accordance with various embodiments of the present disclosure. The package-on-package semiconductor device 390 is similar to the package-on-package semiconductor device 300 shown in FIG. 3 except that the lower end of the shielding layer is level with the surface of the front side interconnect structure 130 as shown in FIG. 3(A). A person skilled in the art would understand the variation shown in FIG. 3(A) can be achieved by slightly modifying the fabrication process.

Figure 4:
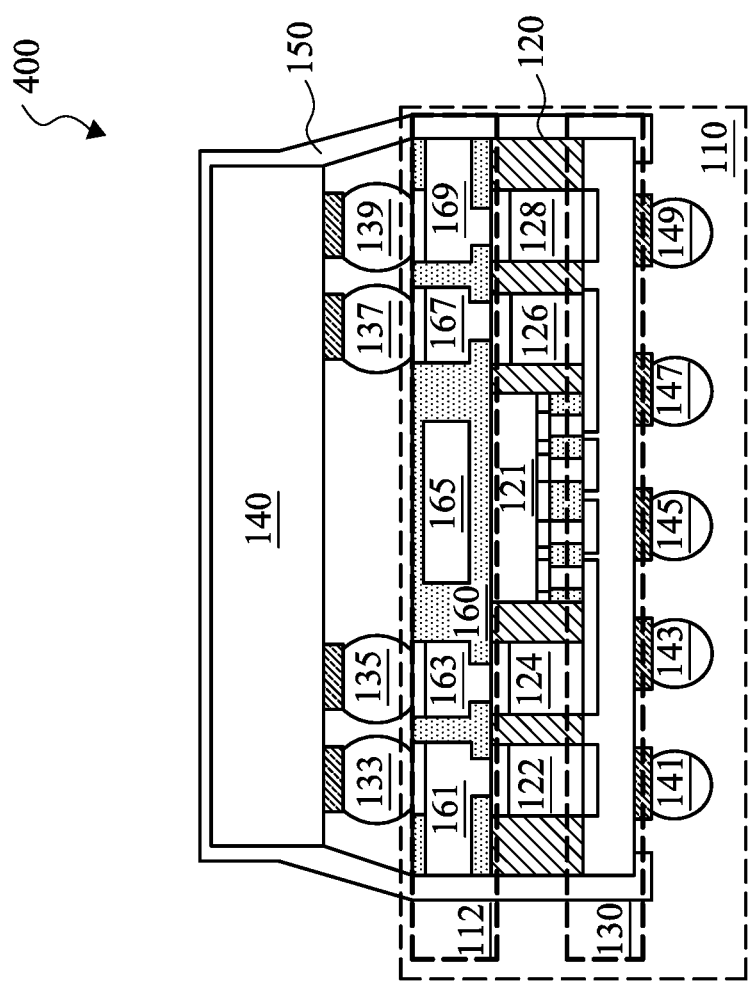
FIG. 4 illustrates a cross sectional view of yet another package-on-package semiconductor device in accordance with various embodiments of the present disclosure.

FIG. 4 illustrates a cross sectional view of yet another package-on-package semiconductor device in accordance with various embodiments of the present disclosure. The package-on-package semiconductor device 400 is similar to the package-on-package semiconductor device 100 shown in FIG. 1 except that the metal shielding layer 150 covers not only the sidewalls of the bottom package 110, but also a portion of the top surface of the front side interconnect structure 130. The detailed formation of the package-on-package semiconductor device 400 will be described below with respect to FIGS. 28-31.

Figure 5:
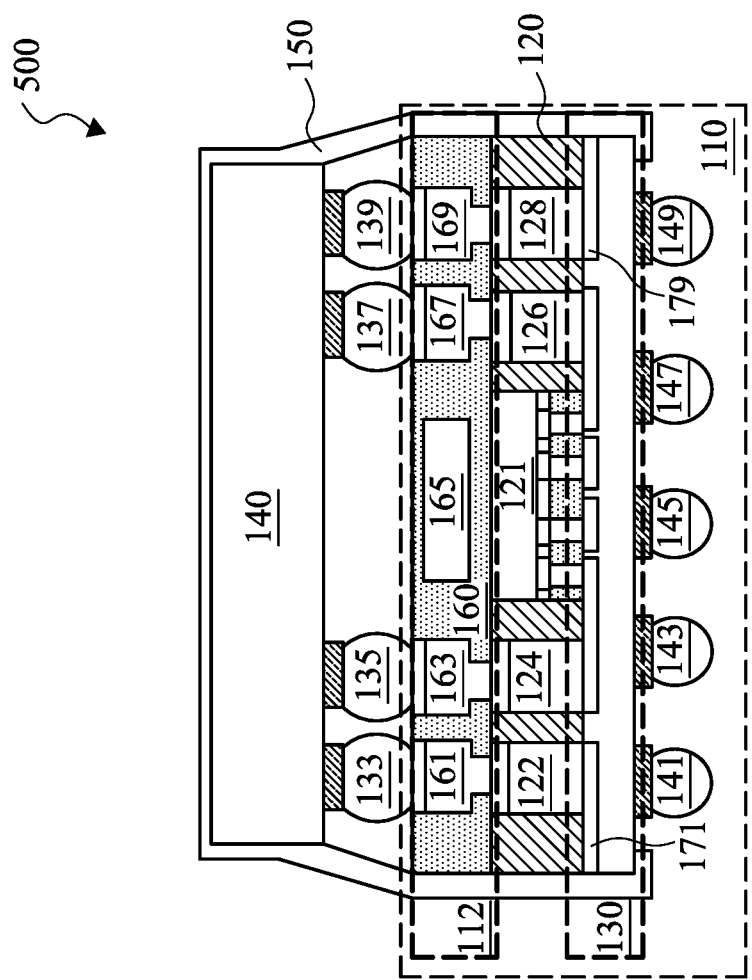
FIG. 5 illustrates a cross sectional view of yet another package-on-package semiconductor device in accordance with various embodiments of the present disclosure.

FIG. 5 illustrates a cross sectional view of yet another package-on-package semiconductor device in accordance with various embodiments of the present disclosure. The package-on-package semiconductor device 500 is similar to the package-on-package semiconductor device 400 shown in FIG. 4 except that the metal shielding layer 150 is connected to the front side redistribution lines 171 and 179 rather than the backside redistribution lines 161 and 169.

Figure 5A:
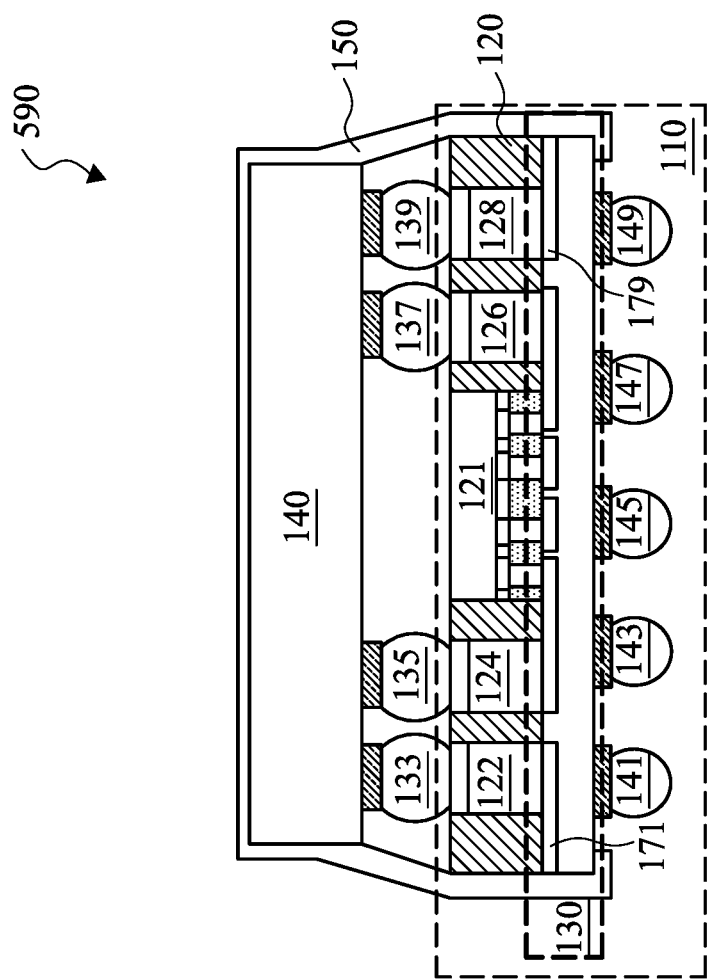
FIG. 5(A) illustrates a cross sectional view of yet another package-on-package semiconductor device in accordance with various embodiments of the present disclosure.

FIG. 5(A) illustrates a cross sectional view of yet another package-on-package semiconductor device in accordance with various embodiments of the present disclosure. The package-on-package semiconductor device 590 is similar to the package-on-package semiconductor device 500 shown in FIG. 5 except that the package-on-package semiconductor device 590 does not comprise the backside interconnect structure 112.

Figure 6:
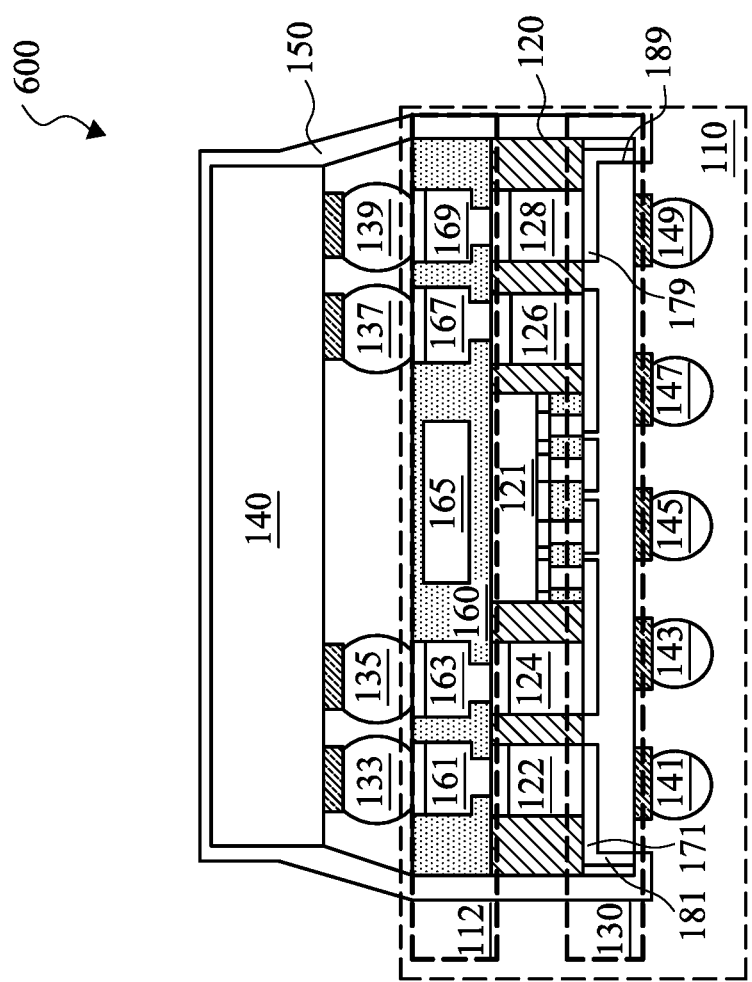
FIG. 6 illustrates a cross sectional view of yet another package-on-package semiconductor device in accordance with various embodiments of the present disclosure.

FIG. 6 illustrates a cross sectional view of yet another package-on-package semiconductor device in accordance with various embodiments of the present disclosure. The package-on-package semiconductor device 600 is similar to the package-on-package semiconductor device 500 shown in FIG. 5 except that the metal shielding layer 150 is connected to the front side redistribution lines 171 and 179 through front side interconnect vias 181 and 189.

FIGS. 7-26 illustrate intermediate steps of fabricating the package-on-package semiconductor device shown in FIG. 1 in accordance with various embodiments of the present disclosure. It should be noted that the fabrication steps as well as the package-on-package structure shown in FIGS. 7-26 are merely an example. A person skilled in the art will recognize there may be many alternatives, variations and modifications.

Figure 7:
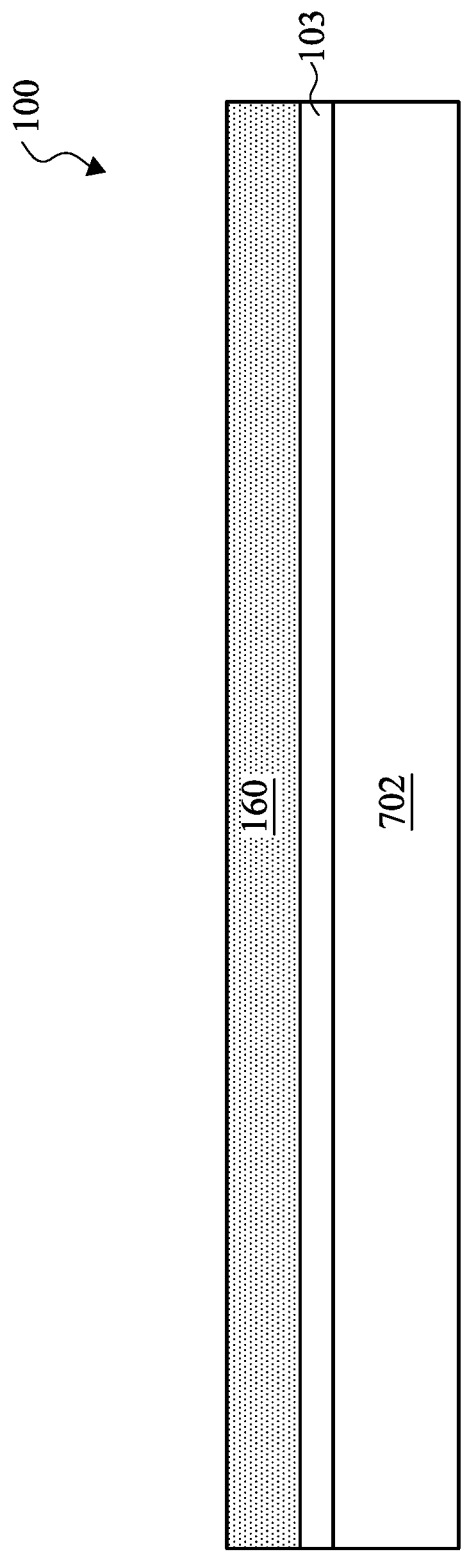
FIGS. 7-26 illustrate intermediate steps of fabricating the package-on-package semiconductor device shown in FIG. 1 in accordance with various embodiments of the present disclosure.

FIG. 7 illustrates a cross sectional view of a semiconductor device in accordance with various embodiments of the present disclosure. As shown in FIG. 7, a release layer 103 is formed on a carrier 702. A dielectric layer 160 is formed on the release layer 103.

The carrier 702 may be formed of silicon, glass, ceramic aluminum oxide, silicon oxide, a combination thereof, and/or the like. In some embodiments, the release layer 103 is formed of an epoxy-based thermal-release material. In alternative embodiments, the release layer 103 may be formed of an ultra-violet (UV) glue, which loses its adhesive property when exposed to UV lights. In alternative embodiments, the release layer 103 may be formed of a light-to-heat conversion layer (LTHC), which loses its adhesive property after the LTHC layer has been exposed to laser light.

The release layer 103 may be formed over the carrier 702 by any suitable semiconductor fabrication techniques. In some embodiments, the release layer 103 may be dispensed as a liquid and cured subsequently. In alternative embodiments, release layer 103 may be laminated onto carrier 702.

The dielectric layer 160 may be alternatively referred to as an inter-layer dielectric (ILD) layer 160 hereinafter. In some embodiments, the ILD layer 160 is formed of a photo-sensitive material such as polybenzoxazole (PBO), polyimide, benzocyclobutene (BCB), low temperature polyimide (LTPI), any combinations thereof and/or the like, which may be easily patterned using a lithography mask. In alternative embodiments, the ILD layer 160 may be formed of a nitride such as silicon nitride, an oxide such as silicon oxide, phosphosilicate glass (PSG), borosilicate glass (BSG), boron-doped phosphosilicate glass (BPSG), any combinations thereof and/or the like. The ILD layer 160 may be formed by suitable fabrication techniques such as such as spinning, film lamination, chemical vapor deposition (CVD), and plasma enhanced CVD (PECVD) and/or the like.

Figure 8:
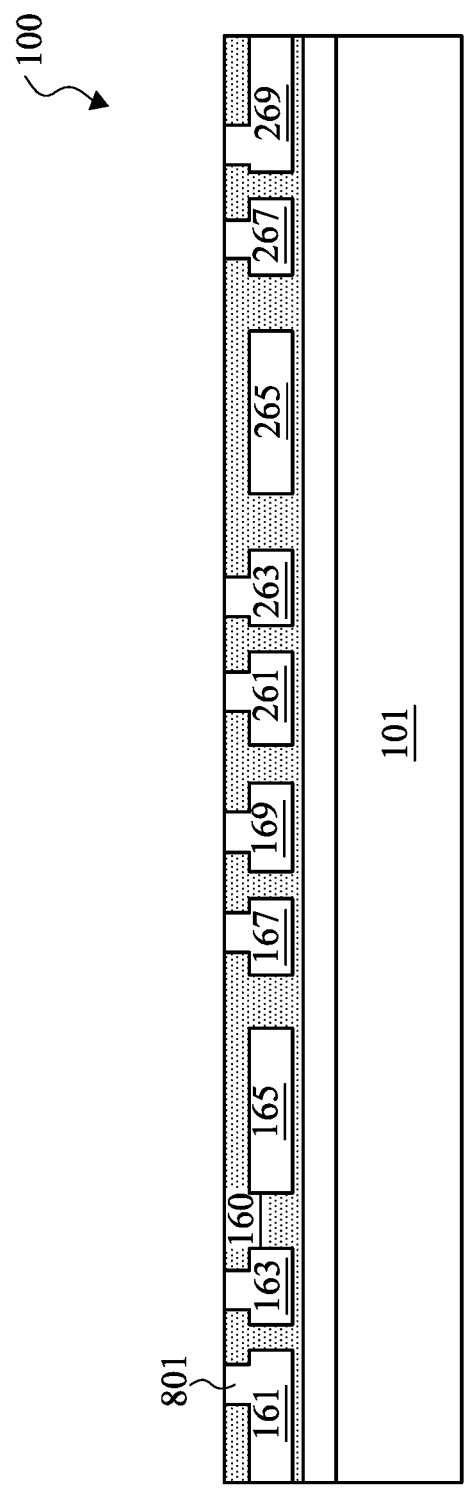

FIG. 8 illustrates a cross sectional view of the semiconductor device shown in FIG. 7 after a backside interconnect structure has been formed over the carrier in accordance with various embodiments of the present disclosure. As shown in FIG. 8, a plurality of redistribution lines 161, 163, 165, 167, 169, 261, 263, 265, 267 and 269 are formed in the dielectric layer 160. In some embodiments, the redistribution lines (e.g., redistribution line 161) may be connected to their respective vias (e.g., via 801) formed on top of the redistribution lines. Alternatively, the top surfaces of the redistribution lines may be exposed. The exposed portions of the redistribution lines may function as contact pads. The redistribution lines may be formed of suitable conductive materials such as aluminum, aluminum alloys, copper or copper alloys and the like. Since redistribution lines 161-169 and 261-269 are formed on a backside of a package-on-package structure, the redistribution lines 161-169 and 261-269 shown in FIG. 8 are alternatively referred to as backside redistribution lines throughout the description.

It should be noted that, in order to achieve the advantageous feature of having a metal shielding layer connected to the backside redistribution lines, during the fabrication step of forming the backside redistribution lines shown in FIG. 8, the leftmost edge of the redistribution line 161 and the rightmost edge of the redistribution line 269 are exposed outside the dielectric layer 160. Furthermore, the widths of the redistribution lines 169 and 261 are controlled such that the redistribution lines 169 and 261 extend beyond dicing edges (not shown) in the dielectric layer 160. As a result, after a dicing process is subsequently applied to the package-on-package semiconductor device 100, the leftmost edge of the redistribution line 261 and the rightmost edge of the redistribution line 169 are exposed outside the dielectric layer 160. The exposed edges of the redistribution line 261 and the redistribution line 169 will be shown in FIG. 24.

Figure 9:
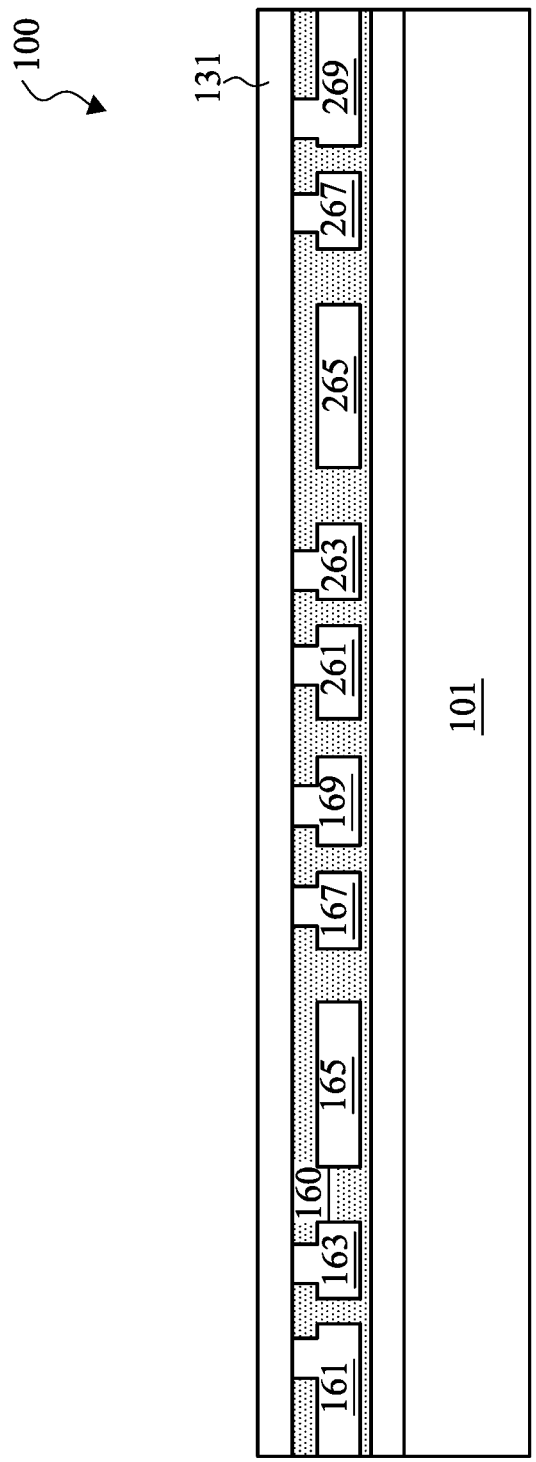

FIG. 9 illustrates a cross sectional view of the semiconductor device shown in FIG. 8 after a seed layer is formed on the dielectric layer in accordance with various embodiments of the present disclosure. A seed layer 131 is formed one the dielectric layer 160. The seed layer 131 may be formed of copper, nickel, gold, titanium, any combinations thereof and/or the like. The seed layer 131 may be formed by suitable deposition techniques such as physical vapor deposition (PVD), CVD and/or the like. The seed layer 131 may have a thickness of between about 500 Angstroms and about 8,000 Angstroms.

Figure 10:
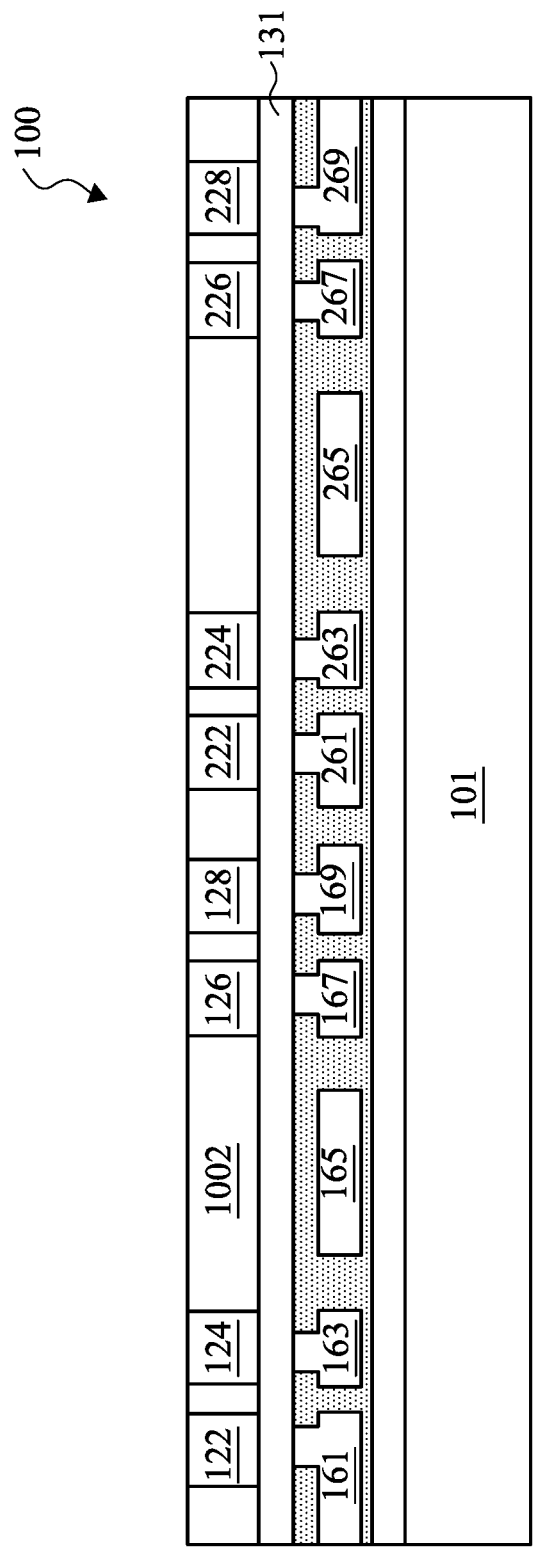

FIG. 10 illustrates a cross sectional view of the semiconductor device shown in FIG. 9 after a plurality of vias have been formed in accordance with various embodiments of the present disclosure. A photoresist layer 1002 is formed over the seed layer 131. In accordance with some embodiments, the photoresist layer 1002 may be formed of suitable photoresist materials such as SU-8 photo-sensitive epoxy, film type polymer materials and/or the like. The photoresist layer 1002 may be formed by suitable semiconductor fabrication techniques such as spin coating, dry film laminating and/or the like.

Once the photoresist layer 1002 is formed, a patterning process is applied to the photoresist layer 1002. In consideration of the location of through vias 122, 124, 126 and 128 shown in FIG. 1, selective areas of the photoresist layer 1002 are exposed to light. As a result, a variety of openings (not shown) are formed on top of the seed layer 131. The formation of the openings in the photoresist layer 1002 involves lithography operations, which are well known, and hence are not discussed in further detail herein to avoid unnecessary repetition.

The openings on top of the seed layer 131 may be filled with a conductive material. The conductive material may comprise copper, although other suitable materials such as aluminum, alloys, tungsten, silver, doped polysilicon, combinations thereof, and/or the like, may alternatively be utilized. The openings may be filled with the conductive material by a plating process.

Figure 11:
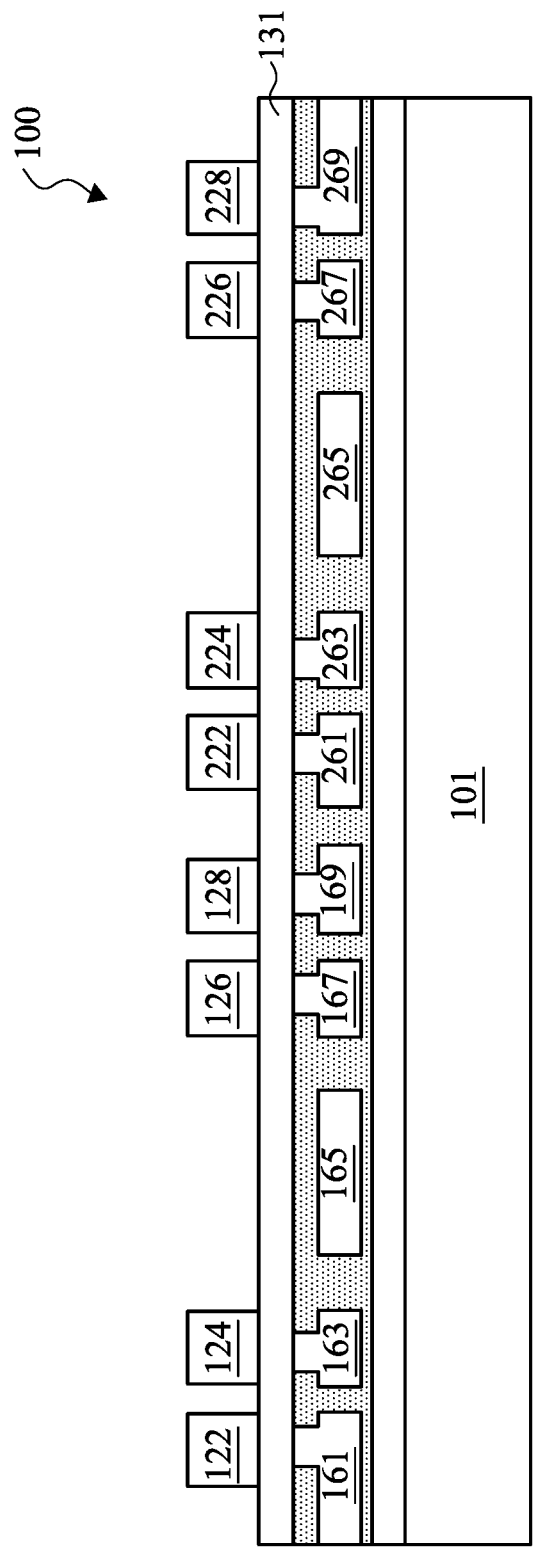

FIG. 11 illustrates a cross sectional view of the semiconductor device shown in FIG. 10 after the remaining photoresist layer has been removed in accordance with various embodiments of the present disclosure. In some embodiments, the remaining photoresist layer 1002 shown in FIG. 10 may be removed by using suitable photoresist stripping techniques such as chemical solvent cleaning, plasma ashing, dry stripping and/or the like. The photoresist stripping techniques are well known and hence are not discussed in further detail herein to avoid unnecessary repetition.

Figure 12:
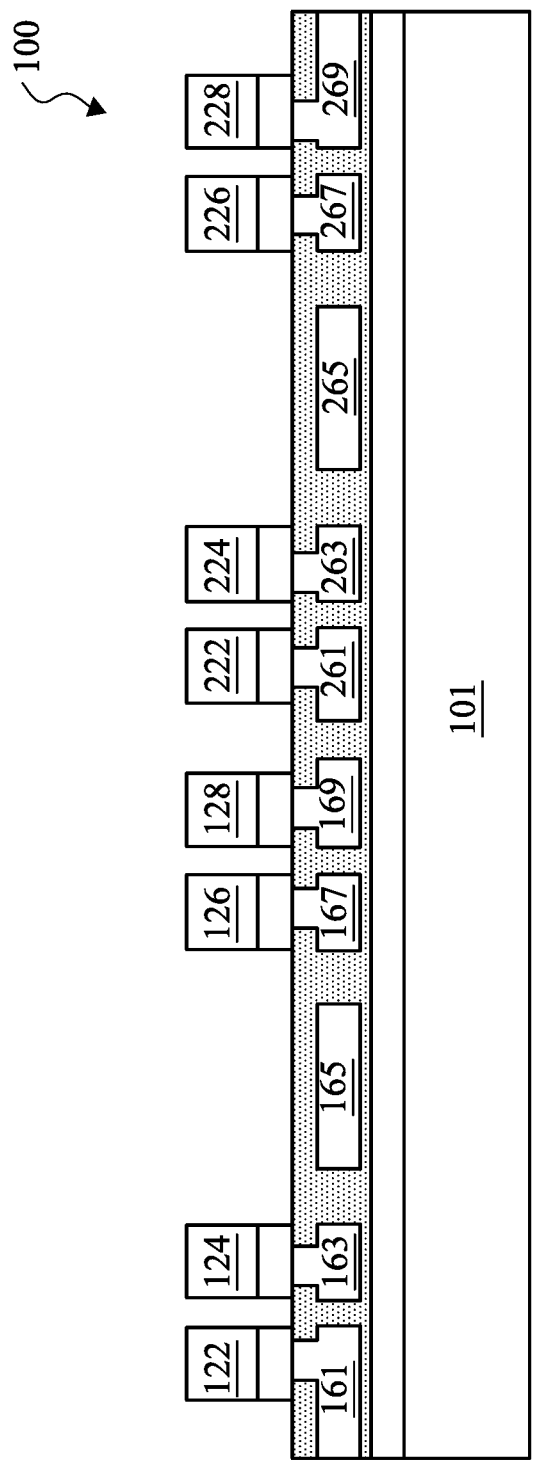

FIG. 12 illustrates a cross sectional view of the semiconductor device shown in FIG. 11 after the exposed portion of the seed layer has been removed in accordance with various embodiments of the present disclosure. The exposed portion of the seed layer 131 shown in FIG. 11 may be removed by using a suitable etching process such as wet-etching, dry-etching and/or the like. The detailed operations of either the dry etching process or the wet etching process are well known in the art, and hence are not discussed herein to avoid unnecessary repetition.

Figure 13:
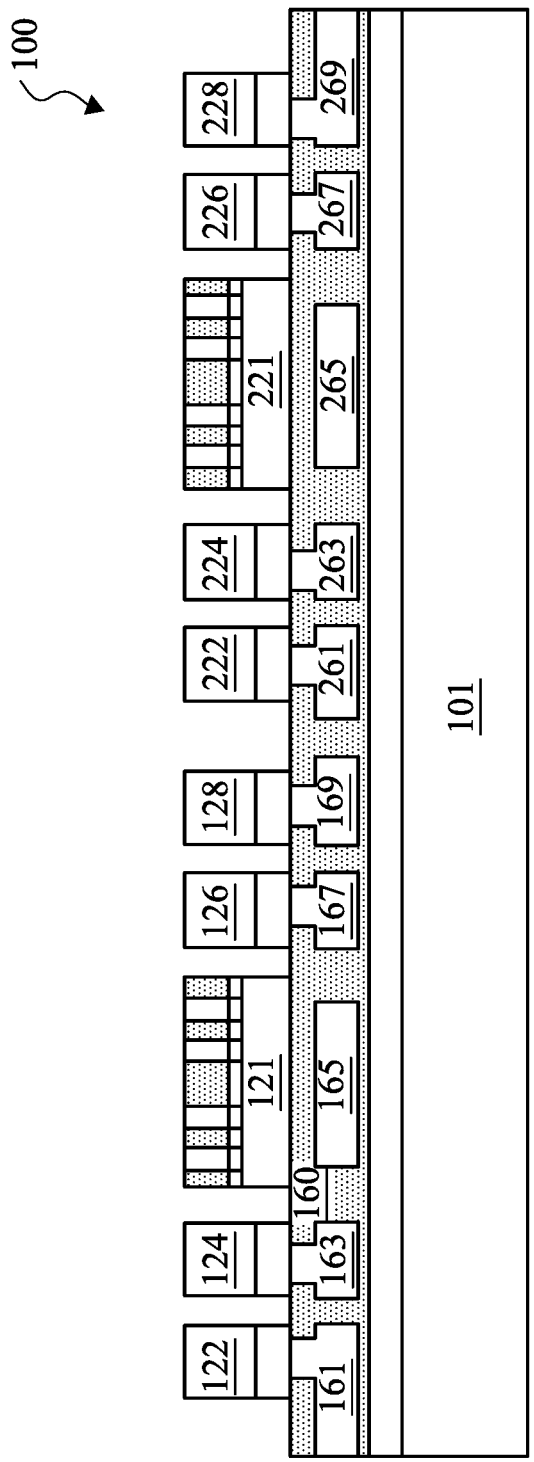

FIG. 13 illustrates a cross sectional view of the semiconductor device shown in FIG. 12 after a first semiconductor die and a second semiconductor are mounted on the dielectric layer in accordance with various embodiments of the present disclosure. Both the first semiconductor die 121 and the second semiconductor die 221 comprise a substrate and a plurality of interconnect structures formed over the substrate. The first semiconductor die 121 and the second semiconductor die 221 are picked and placed on the dielectric layer 160 as shown in FIG. 13. In particular, the substrate sides of the first semiconductor die 121 and the second semiconductor die 221 are in direct contact with the top surface of the dielectric layer 160. In alternative embodiments, the substrate sides of the first semiconductor die 121 and the second semiconductor die 221 are bonded on the dielectric layer 160 through an adhesive layer (not shown).

It should be noted that while FIG. 13 illustrates two semiconductor dies bonded on the dielectric layer 160, the dielectric layer 160 may accommodate any number of semiconductor dies. It should further be noted that FIG. 13 illustrates the top surfaces of the semiconductor dies 121 and 221 are lower than the top surfaces of the through vias (e.g., through via 122). The height of the semiconductor dies 121 and 221 illustrated in FIG. 13 is merely an example, which should not unduly limit the scope of the claims. One of ordinary skill in the art would recognize many variations, alternatives, and modifications. For example, the top surfaces of the through vias (e.g., through via 122) may be level with the top surfaces of the semiconductor dies 121 and 221.

Figure 14:
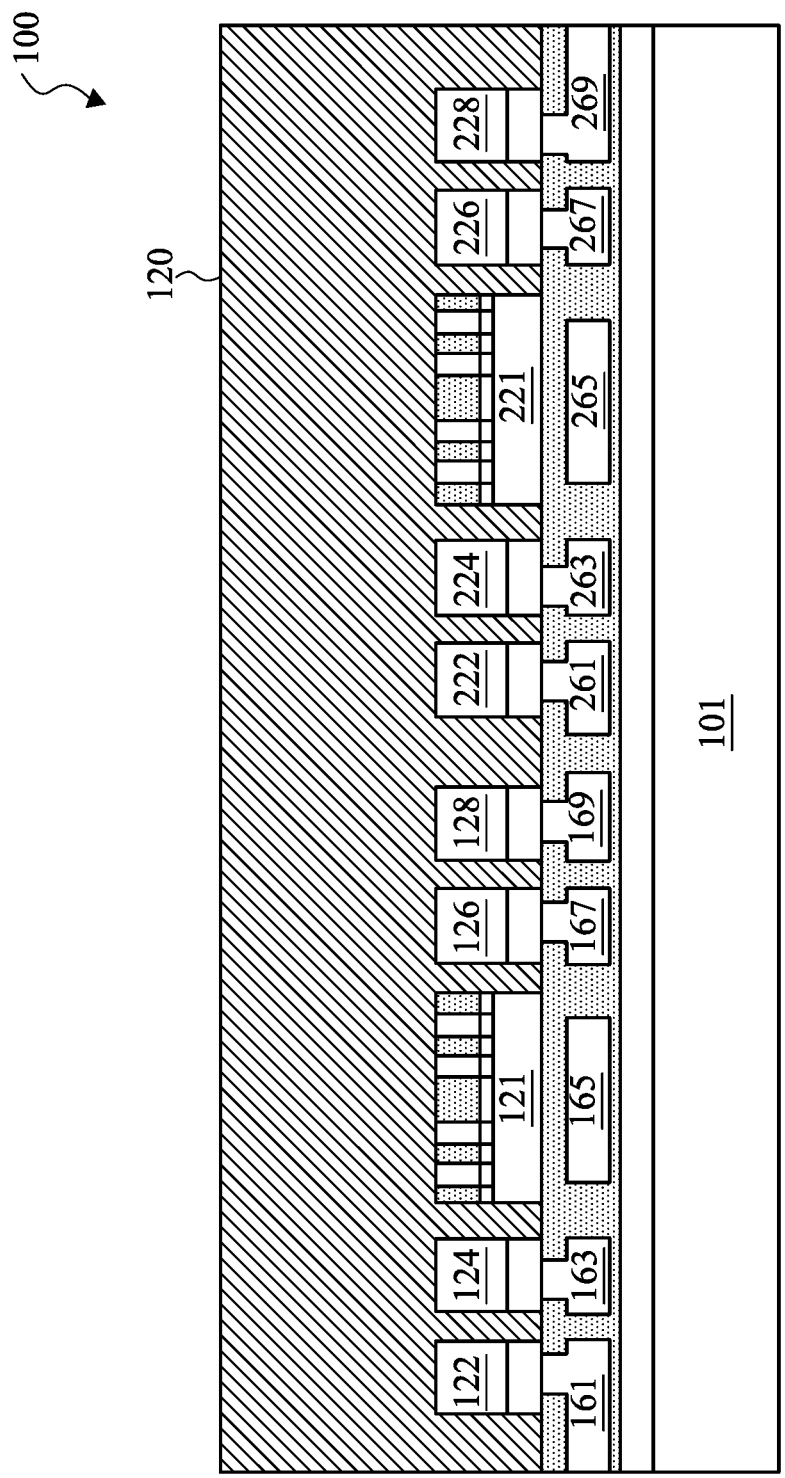

FIG. 14 illustrates a cross sectional view of the semiconductor device shown in FIG. 13 after a molding compound layer is formed over the semiconductor device in accordance with various embodiments of the present disclosure. The molding compound layer 120 may fill the gaps between the semiconductor dies and the adjacent through vias (e.g., through vias 124 and 126) as well as the gap between two adjacent through vias (e.g., through vias 122 and 124). As shown in FIG. 14, the through vias 122, 124, 126 and 128, and the semiconductor dies 121 and 221 are embedded in the molding compound layer 120.

In some embodiments, the molding compound layer 120 may be an epoxy, which is dispensed at the gaps described above. The epoxy may be applied in a liquid or gel form, and may harden after a curing process. In alternative embodiments, the molding compound layer 120 may be formed of curable materials such as polymer based materials, resin based materials, polyimide, epoxy and any combinations of thereof. The molding compound layer 120 can be formed by any suitable dispense techniques or compress molding techniques.

Figure 15:
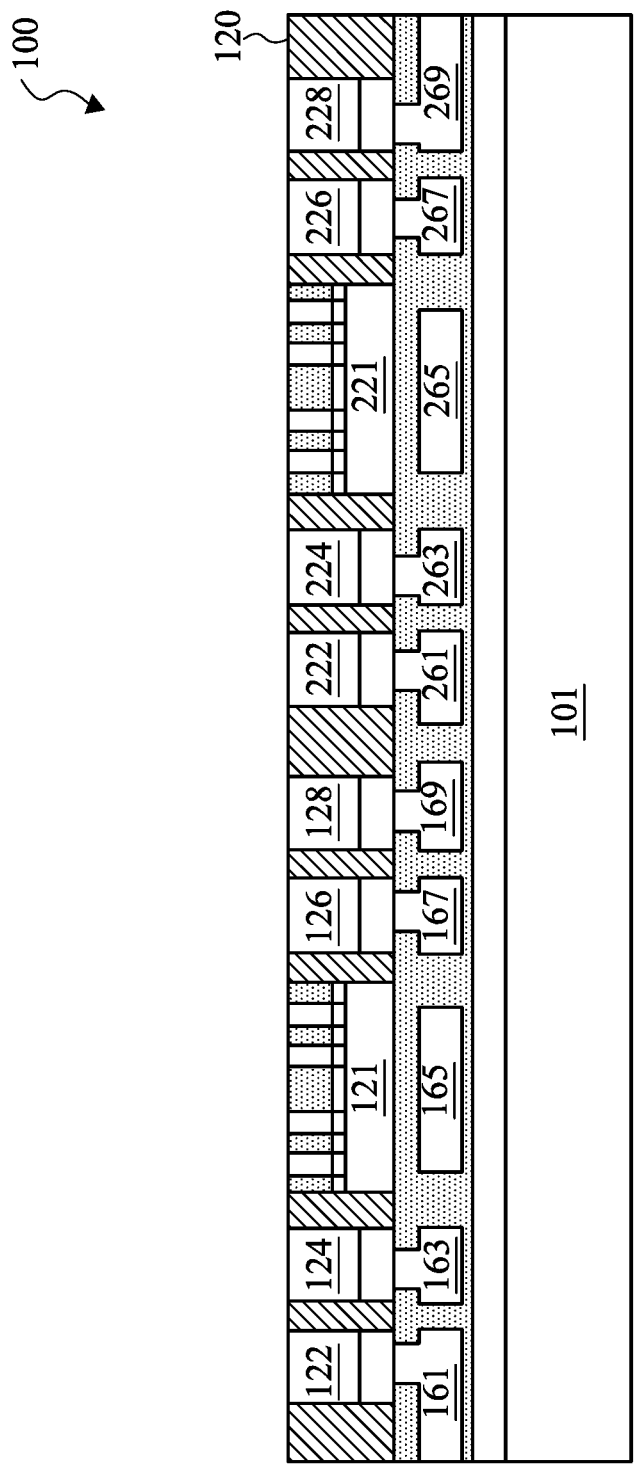

FIG. 15 illustrates a cross sectional view of the semiconductor device shown in FIG. 14 after a grinding process is applied to the top surface of the molding compound layer in accordance with various embodiments of the present disclosure. The top surface of the molding compound layer 120 undergoes a grinding process. The grinding process can employ a mechanical grinding process, a chemical polishing process, an etching process, any combinations thereof and/or the like.

As shown in FIG. 15, the grinding process is applied to the top surface of the molding compound layer 120 until the top surfaces of the through vias (e.g., through via 122) become exposed. In particular, as shown in FIG. 15, the top surface of the interconnect sides of the semiconductor dies 121 and 221 may be exposed outside the molding compound layer 120. As a result of performing the grinding process, the top surfaces of the through vias are level with the top surfaces of the interconnect sides of the semiconductor dies 121 and 221.

Figure 16:
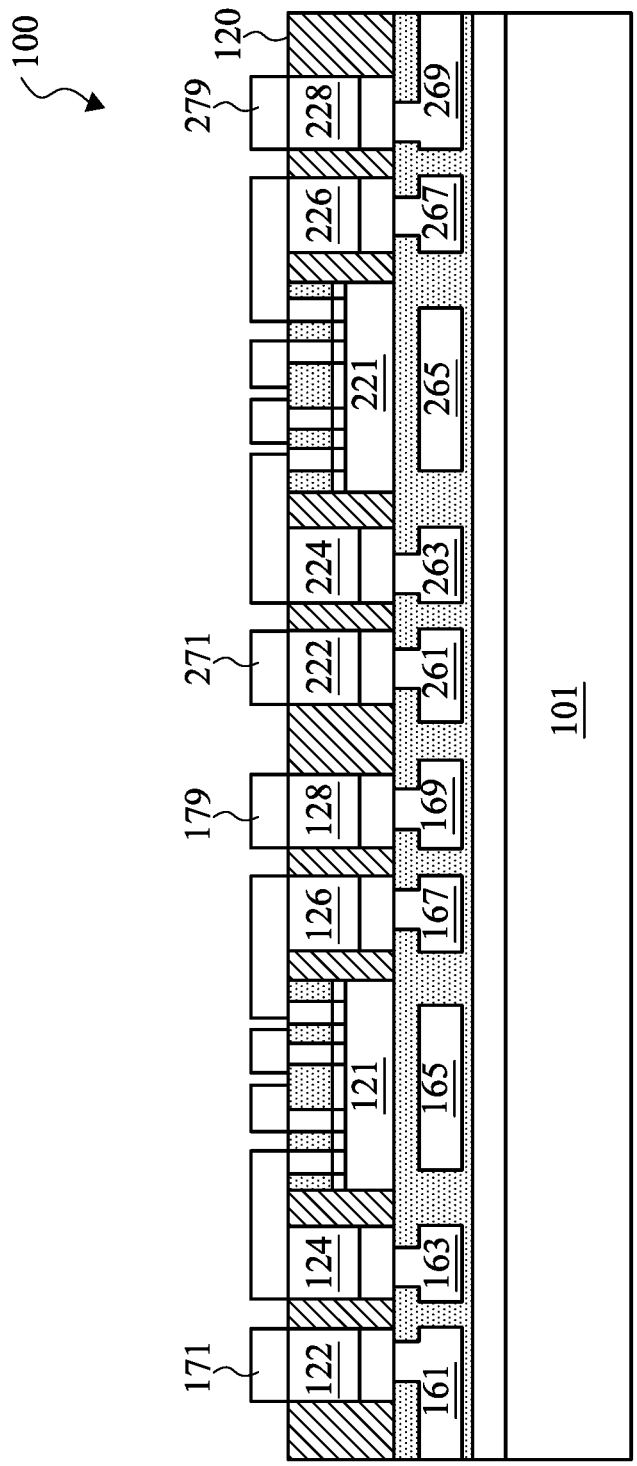

FIG. 16 illustrates a cross sectional view of the semiconductor device shown in FIG. 15 after a plurality of redistribution lines are formed over the molding compound layer in accordance with various embodiments of the present disclosure. The redistribution lines 171, 179, 271 and 279 are formed over the top surface of the molding compound layer 120. As shown in FIG. 16, the redistribution lines 171, 179, 271 and 279 are in direct contact with their respective through vias. The redistribution lines 171, 179, 271 and 279 may be a single material layer, or a multi-layered structure and may be made of metals such as titanium, titanium nitride, aluminum, tantalum, copper and combinations thereof. The redistribution lines 171, 179, 271 and 279 may be made by any suitable method known in the art such as PVD, sputter, CVD, electroplating and/or the like. Throughout the description, the redistribution lines 171, 179, 271 and 279 may be alternatively referred to as the front side redistribution lines 171, 179, 271 and 279.

Figure 17:
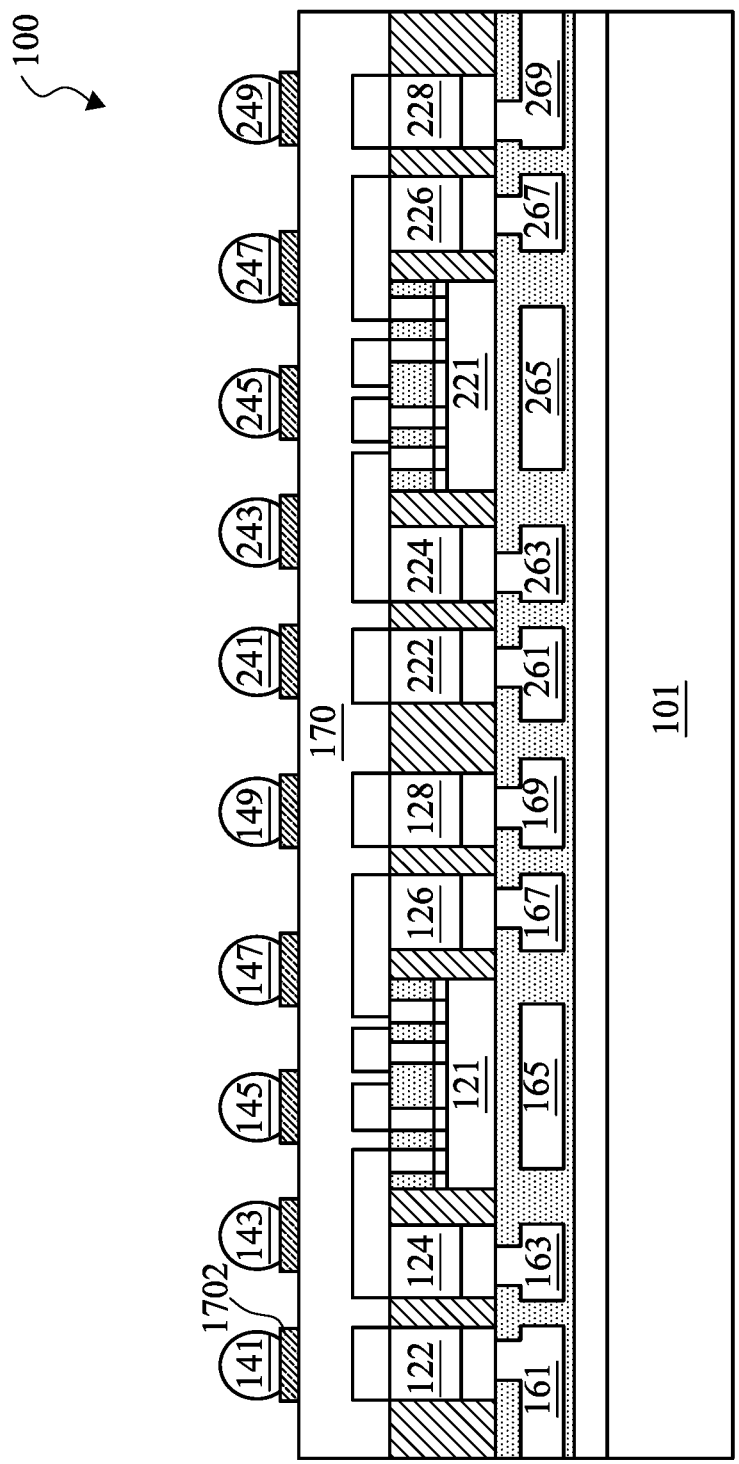

FIG. 17 illustrates a cross sectional view of the semiconductor device shown in FIG. 16 after a plurality of bumps are formed over the front side redistribution lines in accordance with various embodiments of the present disclosure. A dielectric layer 170 is formed over the redistribution lines 171, 179, 271 and 279. This dielectric layer 170 shown in FIG. 17 is merely an example, which should not unduly limit the scope of the claims. One of ordinary skill in the art would recognize many variations, alternatives, and modifications. For example, the dielectric layer 170 may comprise a plurality of dielectric layers.

Once the dielectric layer 170 is formed, a plurality of UBM structures and their respective bumps are formed over the dielectric layer 170 as shown in FIG. 17. The plurality of UBM structures 1702 are formed over the dielectric layer 170. The UBM structures 1702 help to prevent diffusion between the solder balls and the integrated circuits of the semiconductor device, while providing a low resistance electrical connection.

In some embodiments, the bumps 141, 143, 145, 147, 149, 241, 243, 245, 247 and 249 are solder balls. In some embodiments, the solder balls may comprise SAC405. SAC405 comprises 95.5% Sn, 4.0% Ag and 0.5% Cu.

Figure 18:
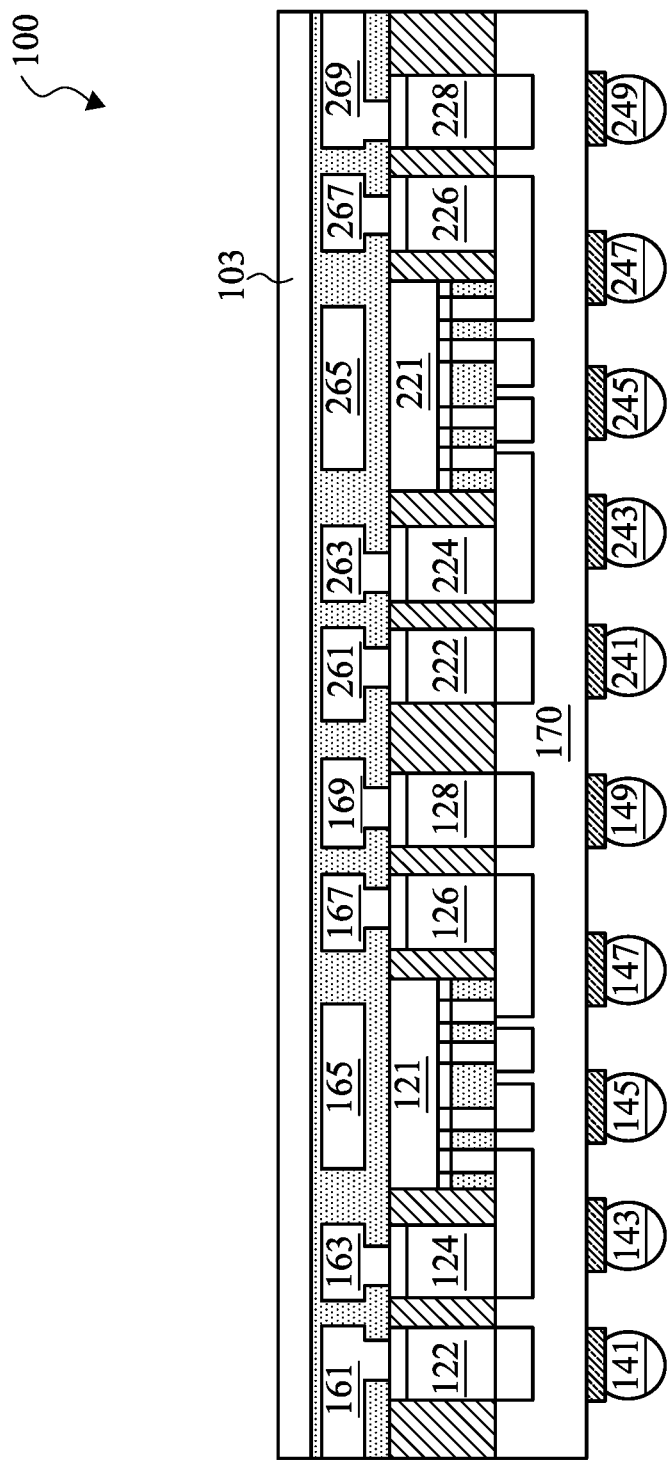

FIG. 18 illustrates a process of removing the carrier in accordance with various embodiments of the present disclosure. The carrier 101 shown in FIG. 17 can be detached from the package-on-package semiconductor device 100. A variety of detaching processes may be employed to separate the package-on-package semiconductor device 100 from the carrier 101. The variety of detaching processes may comprise a chemical solvent, a UV exposure, a laser de-bonding process and the like.

Figure 19:
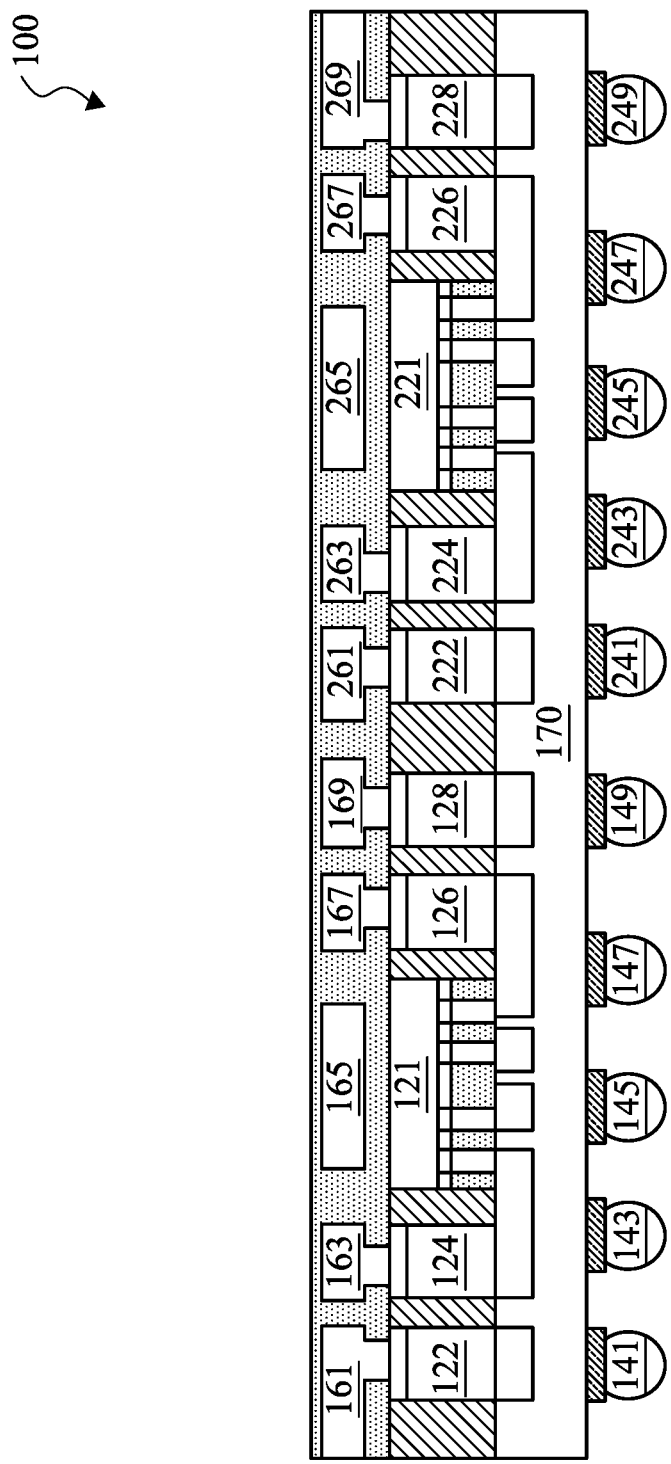

FIG. 19 illustrates a cross sectional view of the semiconductor device shown in FIG. 18 after the release layer has been removed from the semiconductor device in accordance with various embodiments of the present disclosure. The release layer 103 may be removed from the semiconductor device 100 by using a suitable etching process such as a wet cleaning process. In some embodiments, the release layer 103 may be removed from the semiconductor device 100 during the de-bonding process.

Figure 20:
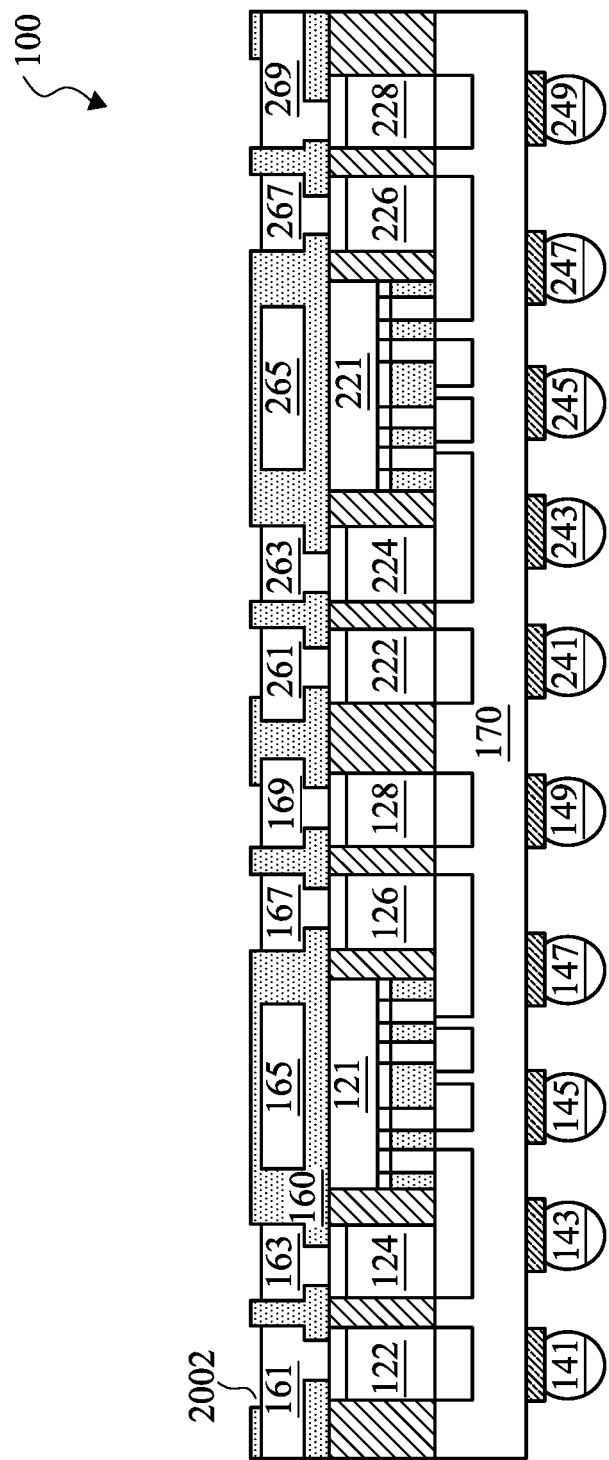

FIG. 20 illustrates a cross sectional view of the semiconductor device shown in FIG. 19 after a patterning process is applied to the surface of the dielectric layer in accordance with various embodiments of the present disclosure. The patterning process may be implemented by using suitable patterning techniques such as an etching process, a laser ablation/laser drilling process and/or the like. According to the shape and location of the redistribution lines in the dielectric layer 160, an etching process or a laser beam (not shown) may be applied to the top surface of the dielectric layer 160 until the top surfaces of the redistribution lines are exposed. After the etching or laser ablation process finishes, a plurality of shallow trenches 2002 are formed over their respective redistribution lines as shown in FIG. 20.

Figure 21:
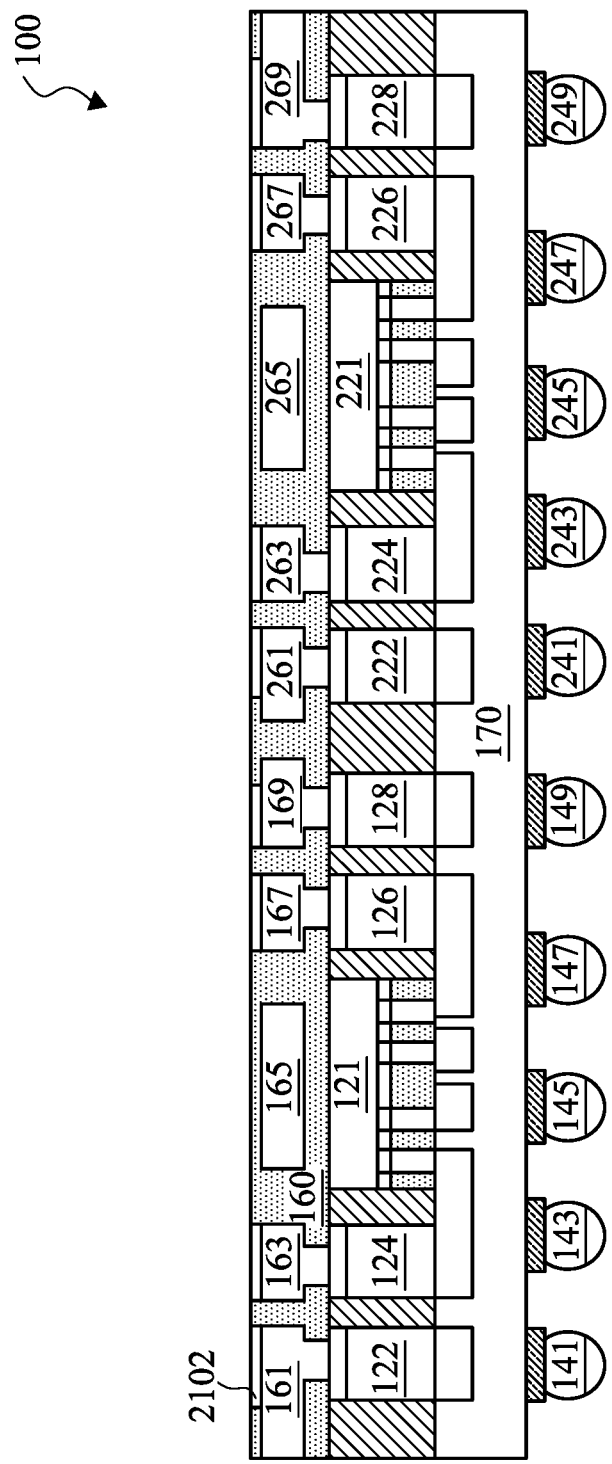

FIG. 21 illustrates a cross sectional view of the semiconductor device shown in FIG. 20 after a plurality of solder layers are formed in the shallow trenches device in accordance with various embodiments of the present disclosure. A solder paste printing process or a plating process may be employed to form solder layers 2102 in the shallow trenches. In some embodiments, the top surfaces of the solder layers 2102 are level with the top surface of the dielectric layer 160. In alternative embodiments, the top surfaces of the solder layers 2102 are lower than the top surface of the dielectric layer 160.

Figure 22:
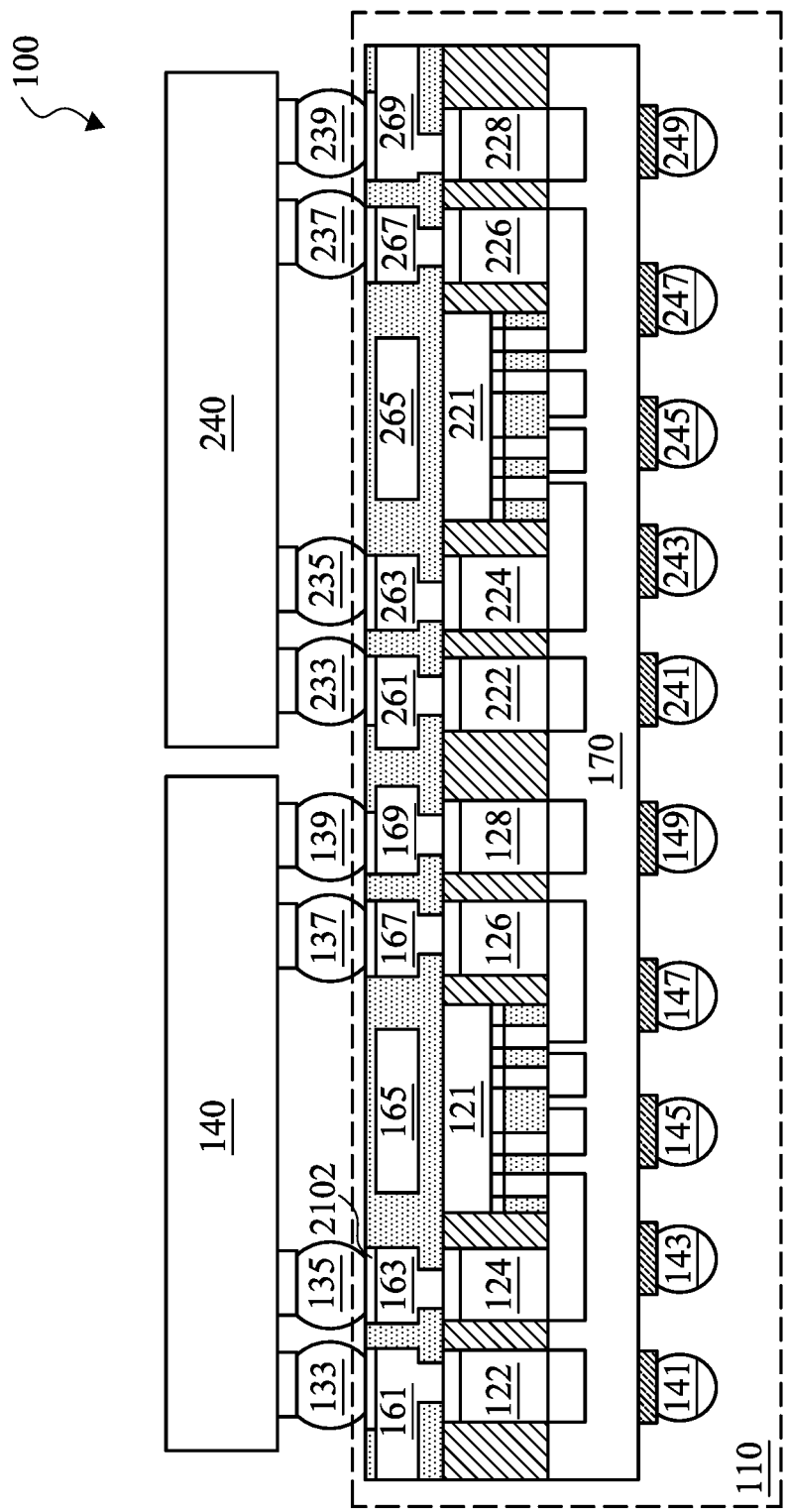

FIG. 22 illustrates a cross sectional view of the semiconductor device shown in FIG. 21 after a first top package and a second top package are mounted on the bottom package in accordance with various embodiments of the present disclosure. The first top package 140 and the second top package 240 may comprise a plurality of stacked dies (not shown), which may be wire bonded to the input and output terminals of the top packages. The stacked dies of the top packages 140 and 240 may comprise memory dies, logic dies, processor dies and/or the like. In some embodiments, the top packages 140 and 240 comprise a plurality of dynamic random-access memory (DRAM) semiconductor devices.

The first top package 140 and the second top package 240 may be bonded on the bottom package through a reflow process. The bonding process comprises placing the bumps 133, 135, 137 and 139 of the first top package 140 and the bumps 233, 235, 237 and 239 of the second top package 240 against the respective solder layers 2102 on the bottom package 110. A reflow process is then performed to melt solder layers 2102, thereby forming a joint structure between the top packages 140 and 240, and the bottom package 110.

Figure 23:
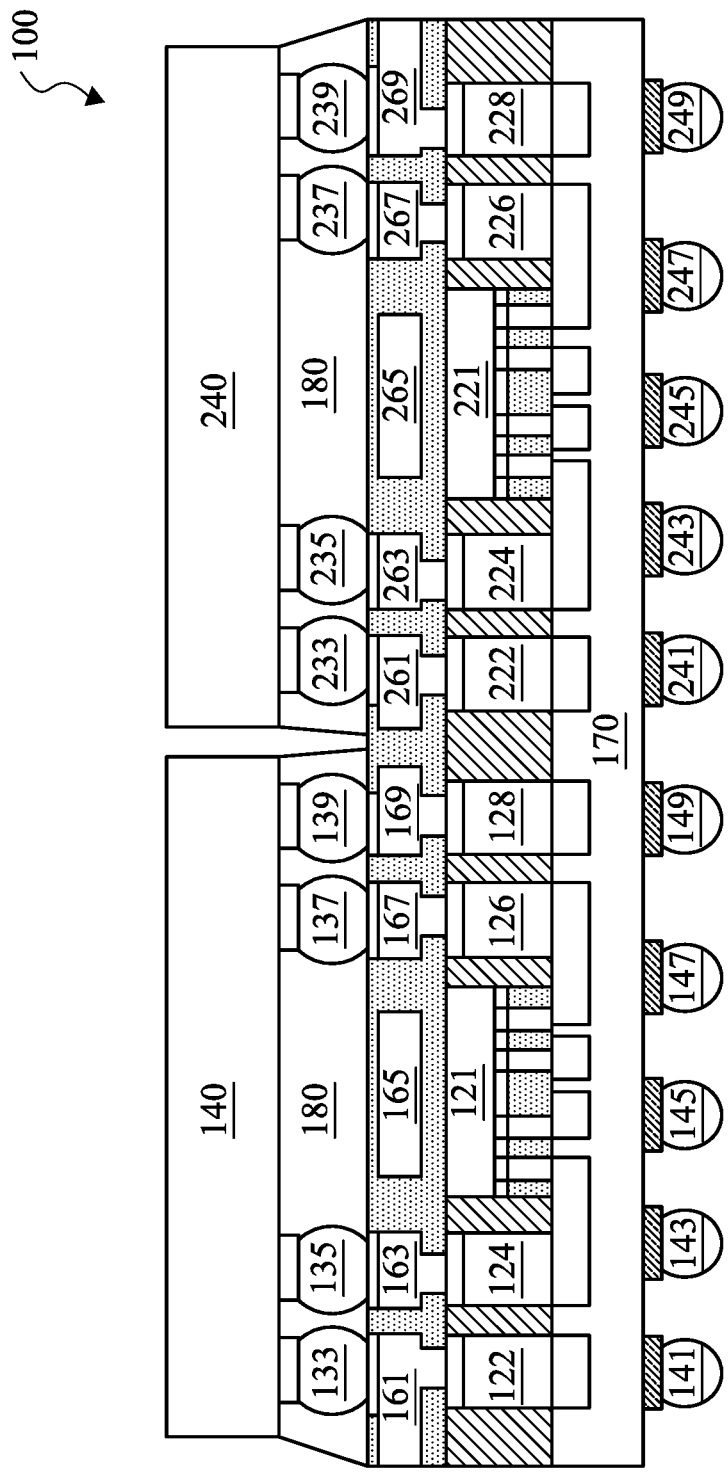

FIG. 23 illustrates a cross sectional view of the semiconductor device shown in FIG. 22 after an encapsulation layer is formed over the semiconductor device in accordance with various embodiments of the present disclosure. The encapsulation layer 180 is formed over the bottom package 110 as shown in FIG. 23. In accordance with some embodiments, the encapsulation layer 180 may be a molding compound layer formed of suitable underfill materials. Throughout the description, the encapsulation layer 180 may be alternatively referred to as an underfill layer 180.

The underfill material layer 180 may fill the gaps between the top packages and the bottom package 110. In some embodiments, the underfill material layer 180 may be formed of an epoxy, which is dispensed at the gaps between top packages and the bottom package. The epoxy may be applied in a liquid form, and may harden after a curing process.

In alternative embodiments, the underfill material layer 180 may be formed of curable materials such as polymer based materials, resin based materials, polyimide, epoxy and any combinations of thereof. The underfill material layer 180 can be formed by any suitable dispense techniques.

Figure 24:
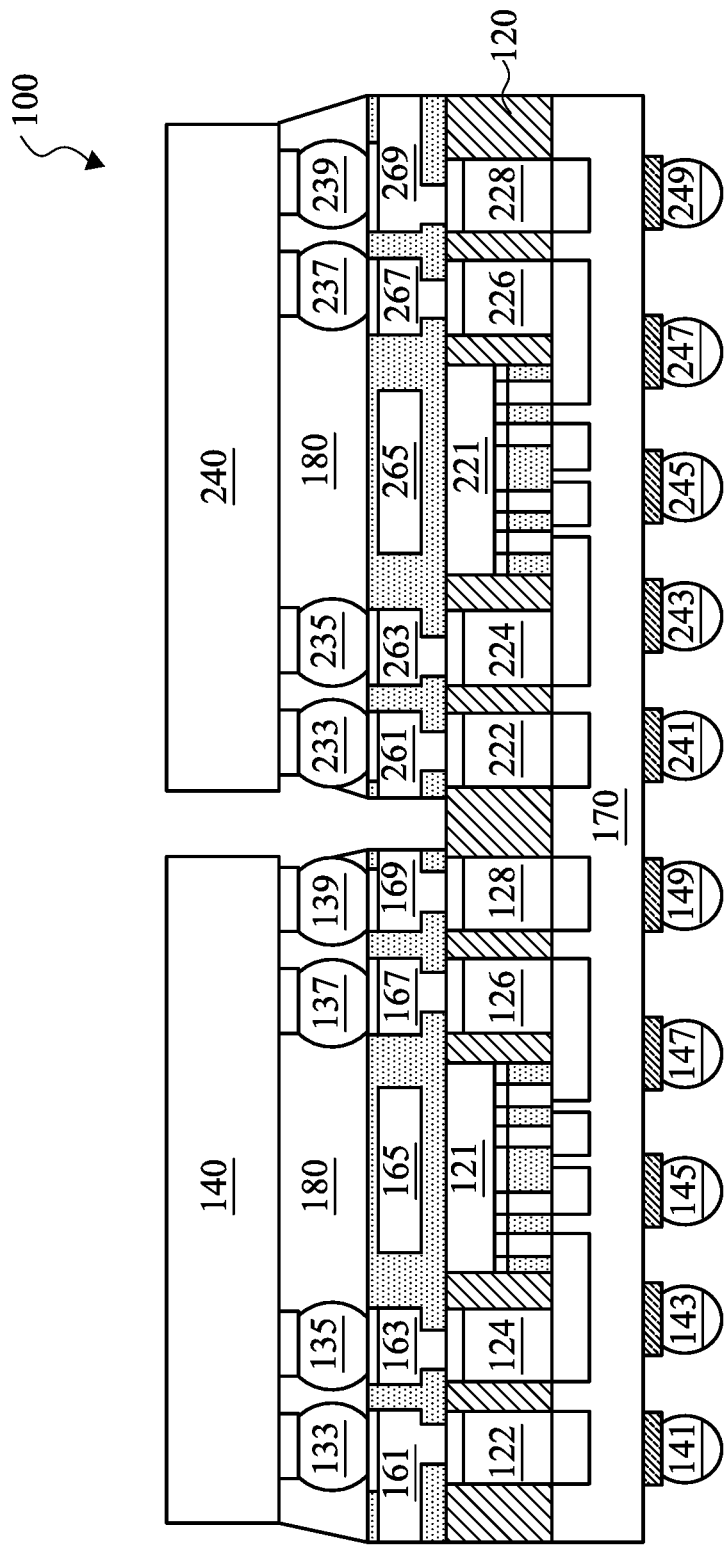

FIG. 24 illustrates a cross sectional view of the semiconductor device shown in FIG. 23 after a dicing process is applied to the semiconductor device in accordance with various embodiments of the present disclosure. A suitable dicing process may be applied the semiconductor device 100 until the top surface of the molding compound layer 120 is exposed or until the dicing blade cuts through the dielectric layer 170 of the semiconductor device 100. In some embodiments, the thickness of the dicing blade is selected such that both the rightmost edge of the redistribution line 169 and the leftmost edge of the redistribution line 261 are exposed after the dielectric material between the redistribution line 169 and the redistribution line 261 has been removed. In alternative embodiments, a laser pre-cut process may be employed to expose both the rightmost edge of the redistribution line 169 and the leftmost edge of the redistribution line 261. The dicing process is well known in the art, and hence is not discussed in detail herein.

Figure 25:
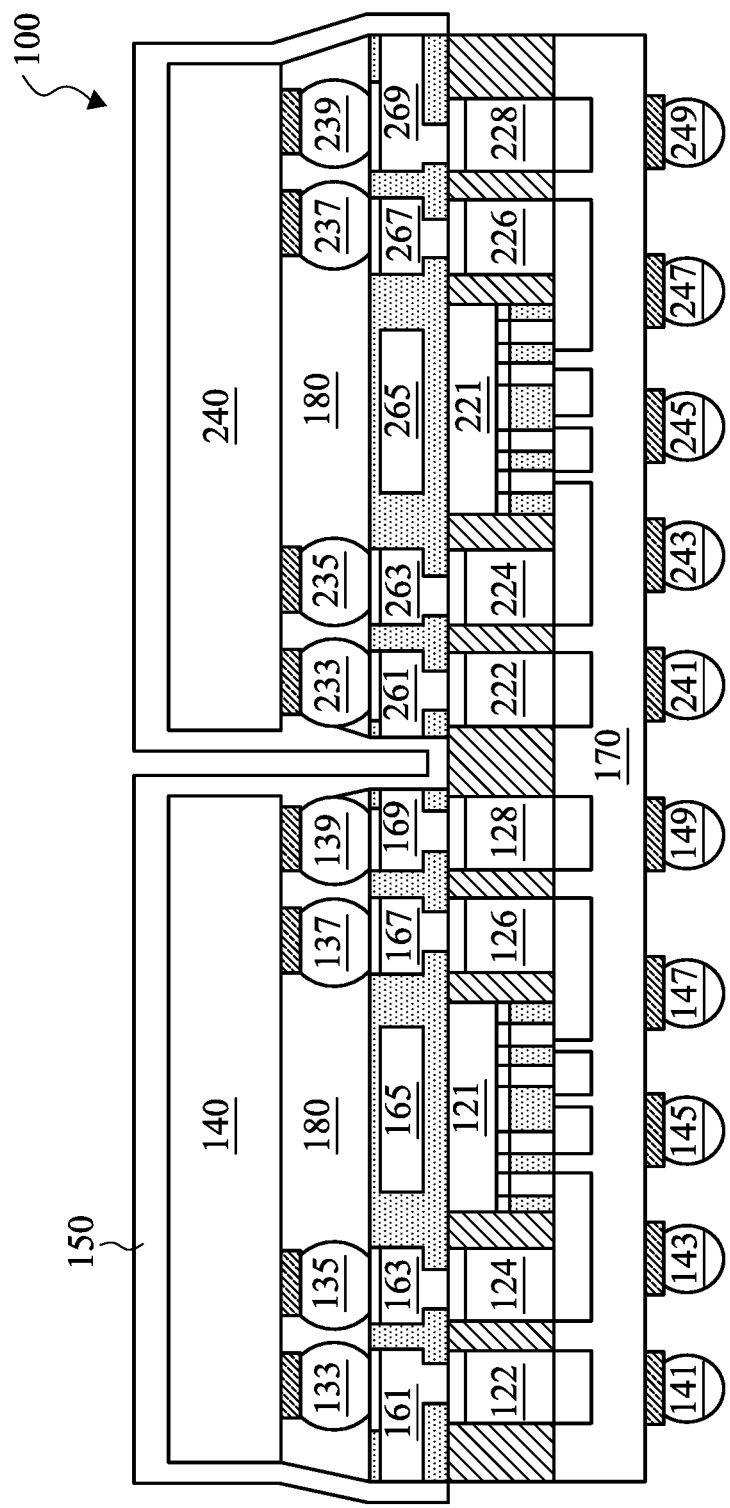

FIG. 25 illustrates a cross sectional view of the semiconductor device shown in FIG. 24 after a metal shielding layer is formed over the semiconductor device in accordance with various embodiments of the present disclosure. The metal shielding layer 150 is conformally formed on the top surface and sidewalls of the package-on-package semiconductor device 100. In some embodiments, the metal shielding layer 150 may comprise a conductive material such as copper, although other metals such as stainless steel, nickel, titanium, titanium-tungsten, silver, any combinations thereof and the like, may also be used. The thickness of metal shielding layer 150 may be between about 1 um and about 45 um, although the thickness may also be greater or smaller. Exemplary formation methods include PVD, spray coating and other applicable methods such as some CVD methods.

In some embodiments, the metal shielding layer 150 is employed to prevent the package-on-package semiconductor device 100 from being interfered with electromagnetic interference. As shown in FIG. 25, the metal shield layer 150 is connected to the redistribution lines 161, 169, 261 and 269. In particular, the leftmost edge of the redistribution line 161 is in direct contact with the metal shielding layer 150. Likewise, at least one edge of the redistribution lines 169, 261 and 269 is in direct contact with the metal shielding layer 150.

It should be noted that while FIG. 25 illustrates the metal shielding layer 150 is a single layer, the metal shielding layer 150 may include a variety of layers. For example, the metal shielding layer 150 may include five stacked layers. A first layer is formed of stainless steel; a second layer is formed of titanium; a third layer is formed of copper; a fourth layer is formed of nickel; a fifth layer is formed of stainless steel.

Figure 26:
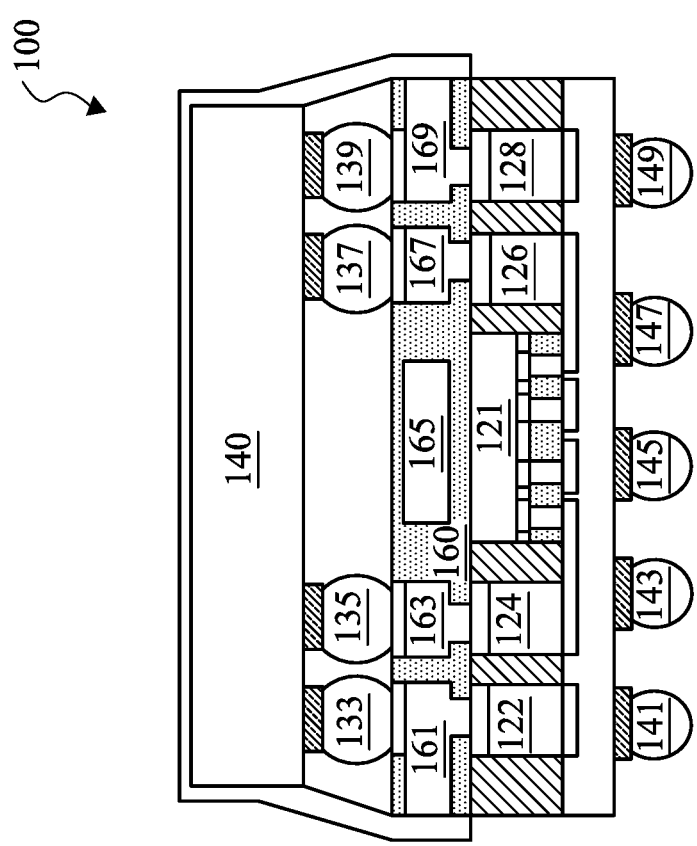

FIG. 26 illustrates a cross sectional view of the semiconductor device shown in FIG. 25 after a dicing process is applied to the semiconductor device in accordance with various embodiments of the present disclosure. A suitable dicing process may be employed to separate the package-on-package semiconductor device 100 shown in FIG. 25 into individual chip packages. The dicing process is well known in the art, and hence is not discussed in detail herein.

Figure 27:
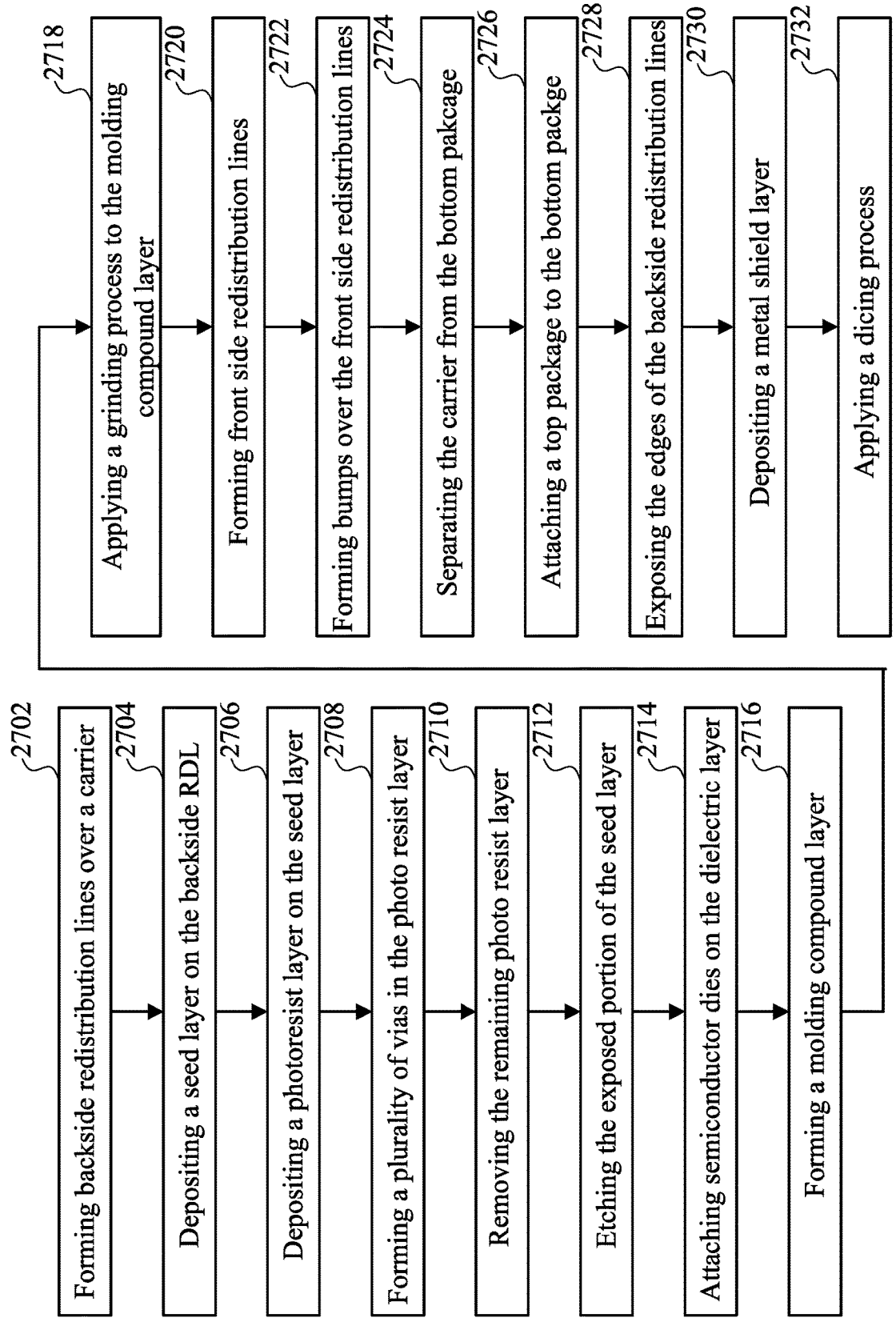
FIG. 27 illustrates a flow chart of a method for forming the semiconductor device shown in FIG. 1 in accordance with various embodiments of the present disclosure.

FIG. 27 illustrates a flow chart of a method for forming the semiconductor device shown in FIG. 1 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 27 may added, removed, replaced, rearranged and repeated.

At step 2702, a dielectric layer is formed over a carrier. A plurality of backside redistribution lines are formed in the dielectric layer. At least one edge of the backside redistribution lines is exposed outside the dielectric layer. At step 2704, a seed layer is deposited on the dielectric layer through suitable semiconductor deposition processes.

At step 2706, a photoresist layer is deposited over the seed layer. At step 2708, a patterning process is applied to the photoresist layer. As a result, a plurality of openings may be formed in the photoresist layer. Through a plating process, a conductive material is filled in the openings to form a plurality of through vias embedded in the photoresist layer.

At step 2710, the remaining photoresist layer is removed through a suitable photoresist stripping process. At step 2712, once the photoresist layer is removed, the exposed portion of the seed layer is etched away through a suitable etching process.

At step 2714, a first semiconductor die and a second semiconductor die are attached to the dielectric layer. In particular, the substrate sides of the first semiconductor die and the second semiconductor die are bonded on the dielectric layer. At step 2716, a molding compound layer is formed over the dielectric layer. The through vias and the semiconductor dies are embedded in the molding compound layer.

At step 2718, a grinding process is applied to the molding compound layer until the top surfaces of the semiconductor dies are level with the top surfaces of the through vias. At step 2720, a plurality of front side redistribution lines are formed over the top surface of the molding compound layer.

At step 2722, a plurality of UBM structures are formed over the front side redistribution lines. A plurality of bumps are formed over their respective UBM structures. At step 2724, a suitable carrier removal technique is employed to separate the carrier from the semiconductor device. At step 2726, a first top package and a second top package are picked and placed on the bottom package. The bumps of the top package and the solder layers of the bottom package form a joint structure through a suitable reflow process.

At step 2728, a suitable dicing blade is employed to remove the dielectric material between two adjacent backside redistribution lines, or remove both the dielectric material between two adjacent backside redistribution lines and the molding material between two adjacent semiconductor dies, thereby exposing the edges of the two adjacent backside redistribution lines. At step 2730, a metal shielding layer is formed on the top and sidewalls of the semiconductor device. The metal shielding layer is connected to the exposed edges of the backside redistribution lines. Alternatively, the metal shielding layer is connected to the exposed edges of the front side redistribution lines. At step 2732, a suitable dicing process is employed to divide the semiconductor device into two package-on-package structures.

FIGS. 28-31 illustrate intermediate steps of fabricating the package-on-package semiconductor device shown in FIG. 4 in accordance with various embodiments of the present disclosure. It should be noted that the fabrication steps as well as the package-on-package structure shown in FIGS. 28-31 are merely an example. A person skilled in the art will recognize there may be many alternatives, variations and modifications.

Figure 28:
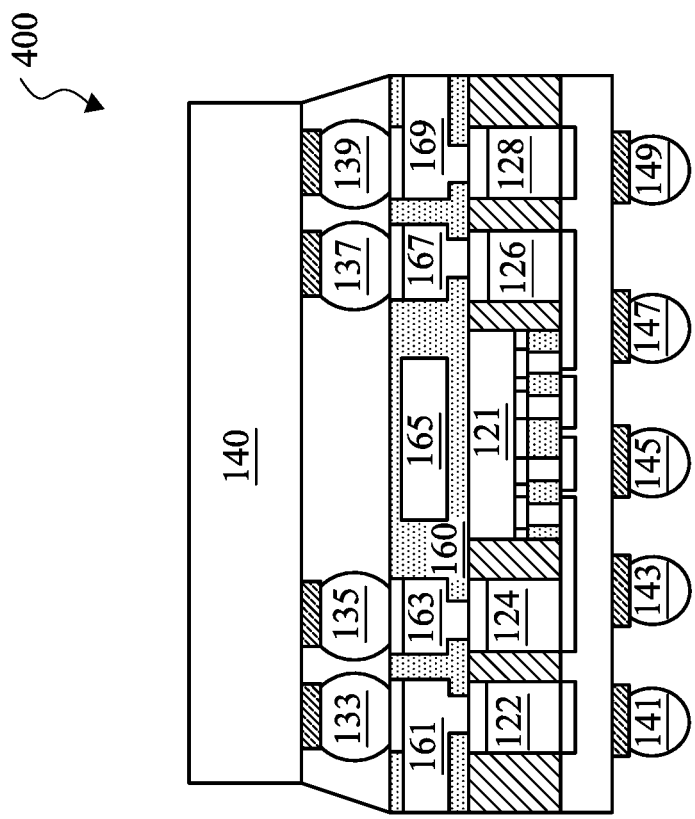
FIGS. 28-31 illustrate intermediate steps of fabricating the package-on-package semiconductor device shown in FIG. 4 in accordance with various embodiments of the present disclosure.

FIG. 28 shows a package-on-package semiconductor device having a top package stacked on a bottom package. The formation process of the package-on-package semiconductor device 400 is similar to that shown in FIGS. 7-24, and hence is not discussed in further detail to avoid repetition.

Figure 29:
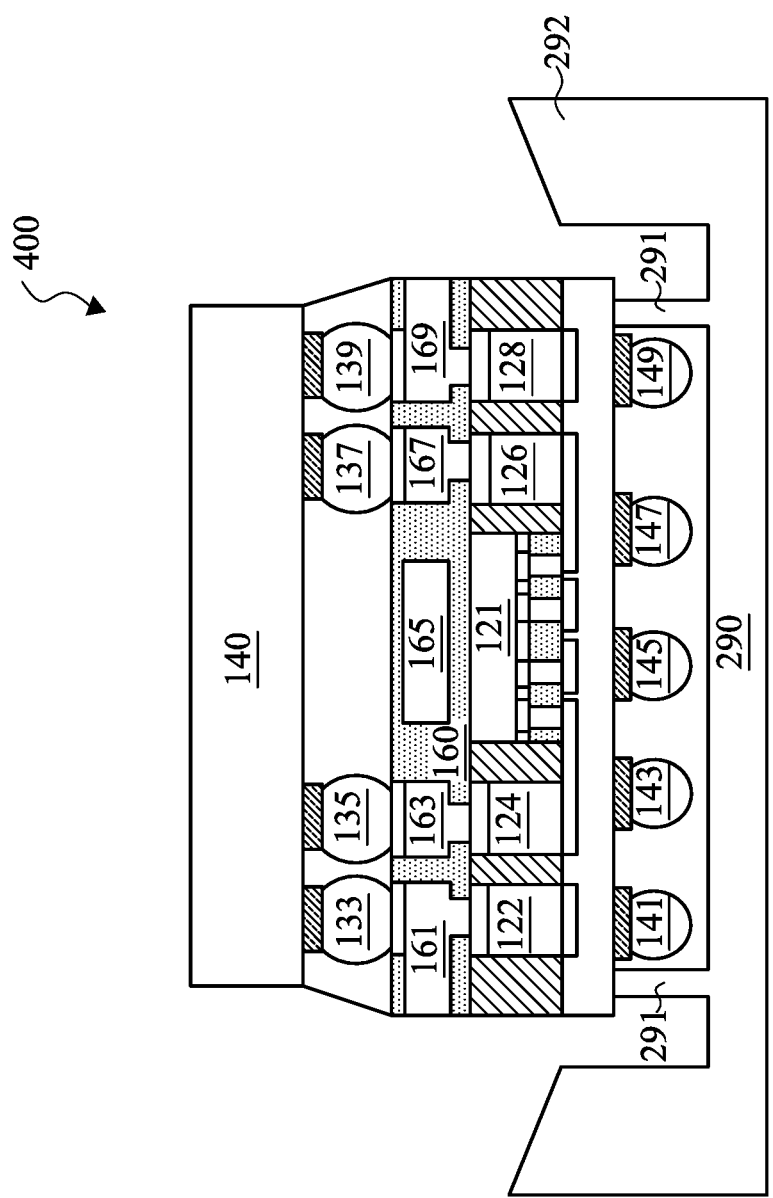

FIG. 29 illustrates a cross sectional view of the semiconductor device shown in FIG. 28 after the semiconductor device is placed on a tray in accordance with various embodiments of the present disclosure. The tray 290 includes an outer wall 292 and an inner wall 291. In some embodiments, the tray 290 is formed of a suitable material such as aluminum, aluminum alloys, stainless steel and the like.

As shown in FIG. 29, the distance between two inner walls 291 is slightly greater than the distance between the leftmost bump 141 and the rightmost bump 149. The distance between the two inner walls 291 shown in FIG. 29 is merely an example. Depending on different applications and design needs, there may be many variations, modifications and alternatives. In some embodiments, the two inner walls may be in direct contact with the bumps 141 and 149 respectively. In alternative embodiments, the inner walls 291 may be placed away from the bump 141 and 149.

Figure 30:
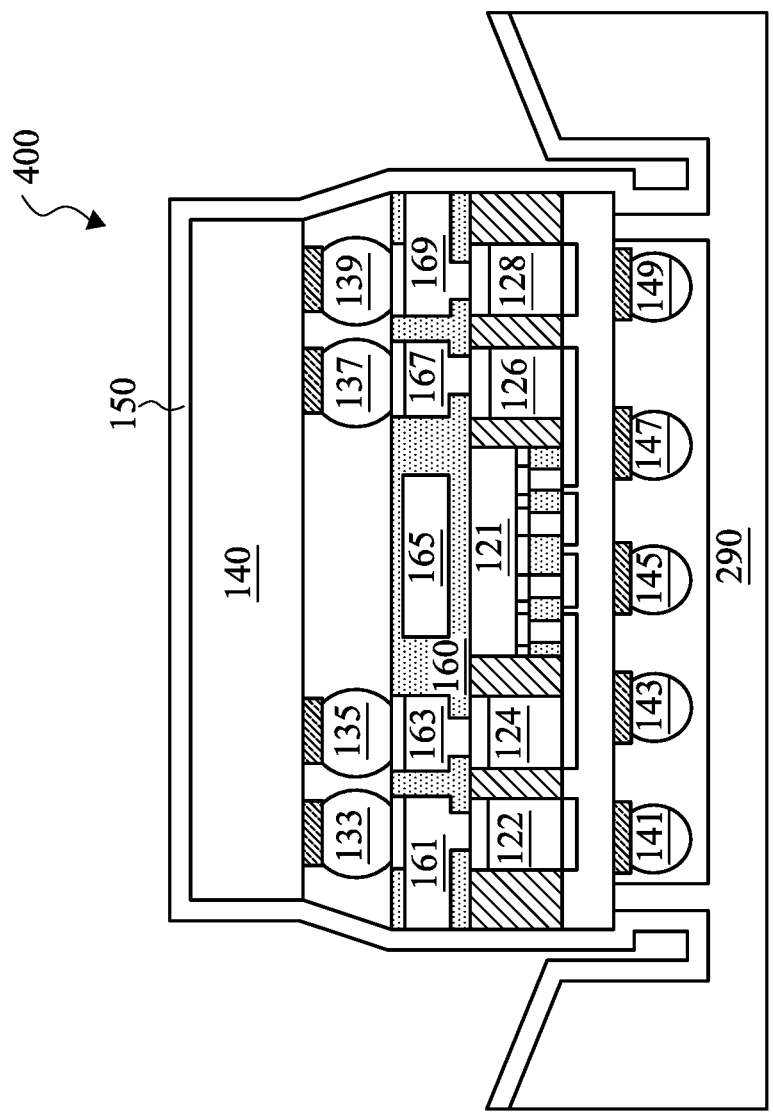

FIG. 30 illustrates a cross sectional view of the semiconductor device shown in FIG. 29 after a metal shielding layer is deposited over the semiconductor device in accordance with various embodiments of the present disclosure. The metal shielding layer 150 has been described above with respect to FIG. 25, and hence is not discussed again to avoid repetition. As shown in FIG. 30, the metal shielding layer 150 is formed on the package-on-package semiconductor device 400 as well as the tray 290. It should be noted that the metal shielding layer 150 formed along the inner wall 291 is much thinner than the other portions of the metal shielding layer. Alternatively, the metal shielding layer may be not formed on the inner wall 291. Such a thin metal shielding layer along the inner wall 291 helps the separation process between the package-on-package semiconductor device 400 and the tray 290 run more smoothly and effectively.

One advantageous feature of having the inner walls shown in FIG. 30 is that the inner walls 291 prevent the metal shielding layer 150 from being shorted to the bumps 141 and 149. As a result, the reliability of the package-on-package semiconductor device 400 may be improved. Furthermore, the tray 290 shown in FIG. 30 also helps to improve the coating profile along the sidewall of the package-on-package semiconductor device 400. For example, by employing the tray having the inner wall shown in FIG. 30, the metal shielding layer 150 may have a uniform thickness along the sidewalls of the package-on-package semiconductor device 400.

Figure 31:
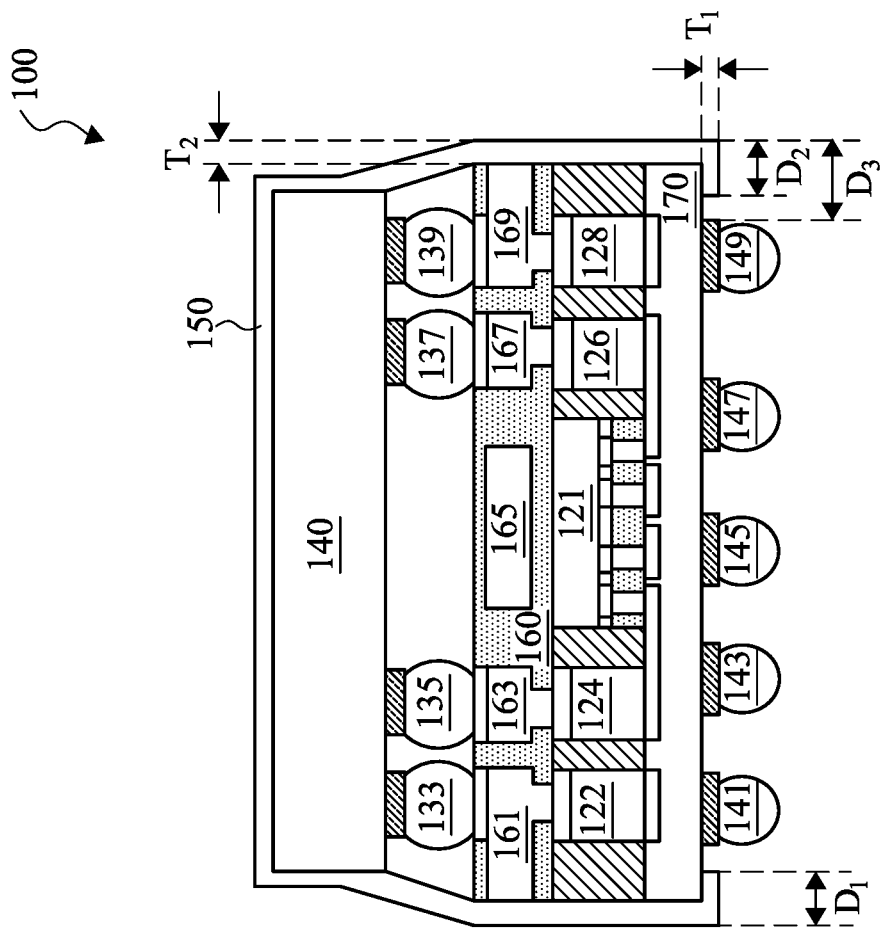

FIG. 31 illustrates a cross sectional view of the semiconductor device shown in FIG. 30 after the semiconductor device has been separated from the tray in accordance with various embodiments of the present disclosure. The metal shielding layer 150 has been broken at the corners formed by the inner walls and the dielectric layer 170. As shown in FIG. 31, after the package-on-package semiconductor device 400 has been separated from the tray 290, the metal shielding layer 150 covers the top surface, sidewalls and portions of the bottom surface of the package-on-package semiconductor device 400.

The portion of the metal shielding layer 150 underneath the dielectric layer 170 and on the left side has a width D1. The portion of the metal shielding layer 150 underneath the dielectric layer 170 and on the right side has a width D2. Both D1 and D2 are adjustable. More particularly, by controlling the distance between the inner walls, the values of D1 and D2 may vary accordingly. In some embodiments, D1 is equal to D2. Alternatively, depending on design needs, D1 is not equal to D2.

The distance between bump 149 and the outer edge of the package-on-package semiconductor device 400 is defined as D3 as shown in FIG. 31. In some embodiments, D3 is greater than D2. More particularly, D2 is approximately less than or equal to 50% of D3. For example, D3 is equal to 150 um; D2 is equal to 75 um.

The thickness of the portion of the metal shielding layer 150 along the sidewall of the package-on-package semiconductor device 400 is defined as T2. T2 is in a range from about 0.05 um to about 25 um. The thickness of the portion of the metal shielding layer 150 on the bottom surface of the package-on-package semiconductor device 400 is defined as T1. T1 is in a range from about 0.01 um to about 2 um. In some embodiments, T2 is greater than T1.

One advantageous feature of having the tray shown in FIGS. 29-30 is that the tray helps to form a conformal coating on the bottom surface of the package-on-package semiconductor device 400. More particularly, the metal shielding layer 150 of FIG. 31 shows some common coating defects such as a coating having a smeared finish, a short circuit between a coating and its adjacent bump, and the like have been overcome.

Figure 32:
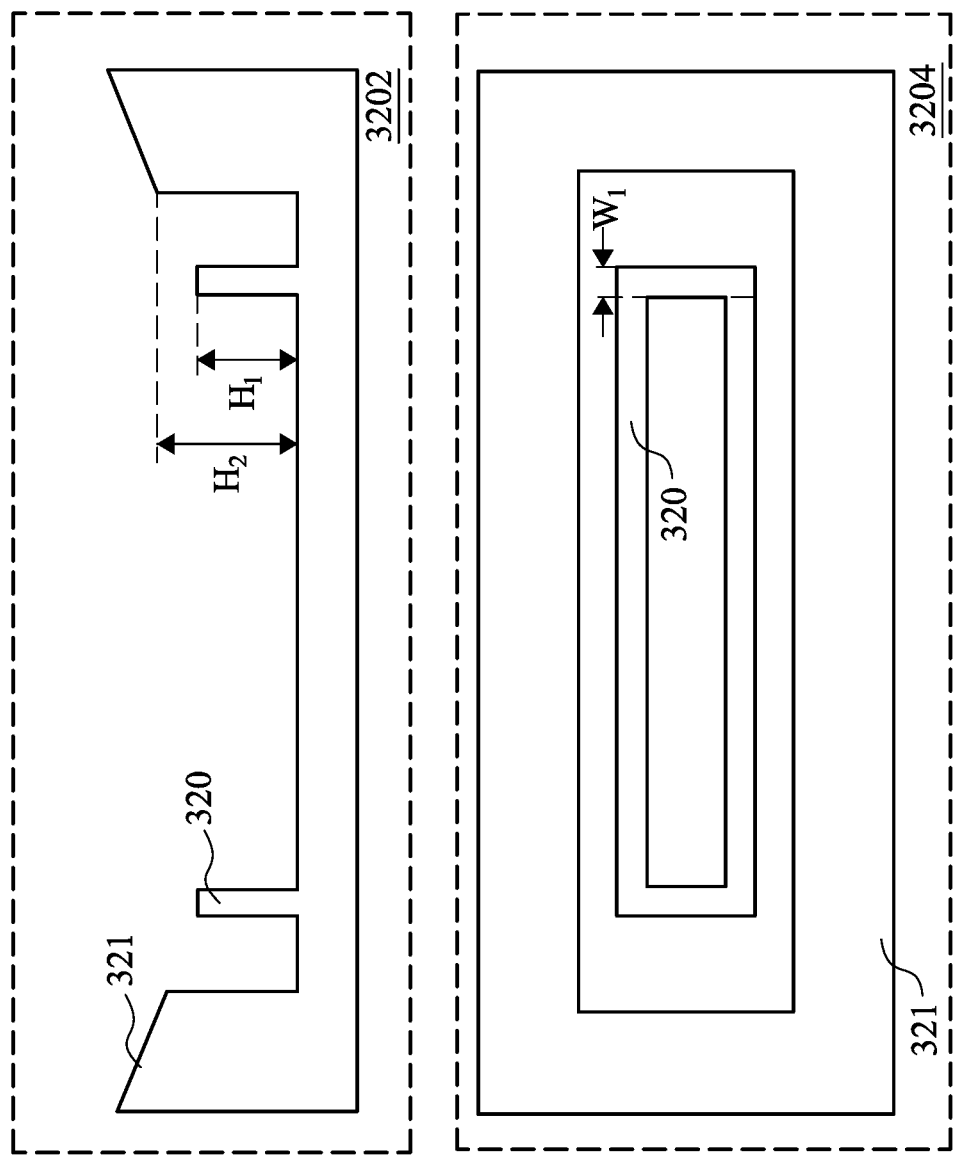
FIG. 32 illustrates a cross sectional view and a top view of the tray shown in FIGS. 29-30 in accordance with various embodiments of the present disclosure.

FIG. 32 illustrates a cross sectional view and a top view of the tray shown in FIGS. 29-30 in accordance with various embodiments of the present disclosure. In the cross sectional view 3202, the tray has an inner wall 320 and an outer wall 321. There is a cavity between the inner wall 320 and the outer wall 321.

In some embodiments, the outer wall 321 has an uneven top surface as shown in FIG. 32. The height of the outer wall 321 is defined as H2 as shown in FIG. 32. The height of the inner wall 320 is defined as H1. In some embodiments, H1 is in a range from about 80 um to about 400 um.

As shown in the cross sectional view 3202, the inner wall 320 is substantially rectangular in shape. However, as one having ordinary skill in the art will recognize, the shape shown in FIG. 32 is merely an exemplary process and is not meant to limit the current embodiments. It is within the scope and spirit of the disclosure for the inner wall to comprise other shapes, such as, but no limited to oval, square, or polygon.

The top view 3204 shows both the inner wall 320 and the outer wall 321 are rectangular in shape. The width of the inner wall 320 is defined as W1. W1 is in a range from about 50 um to about 500 um. In some embodiments, an anti-slip layer (not shown) may be formed on the top surface of the inner wall 320. The anti-slip layer may be formed of suitable materials such as polymer, epoxy, rubber and the like. The anti-slip layer is employed to provide friction forces, thereby preventing the package-on-package semiconductor device 400 from slipping along X and Y directions.

Figure 33:
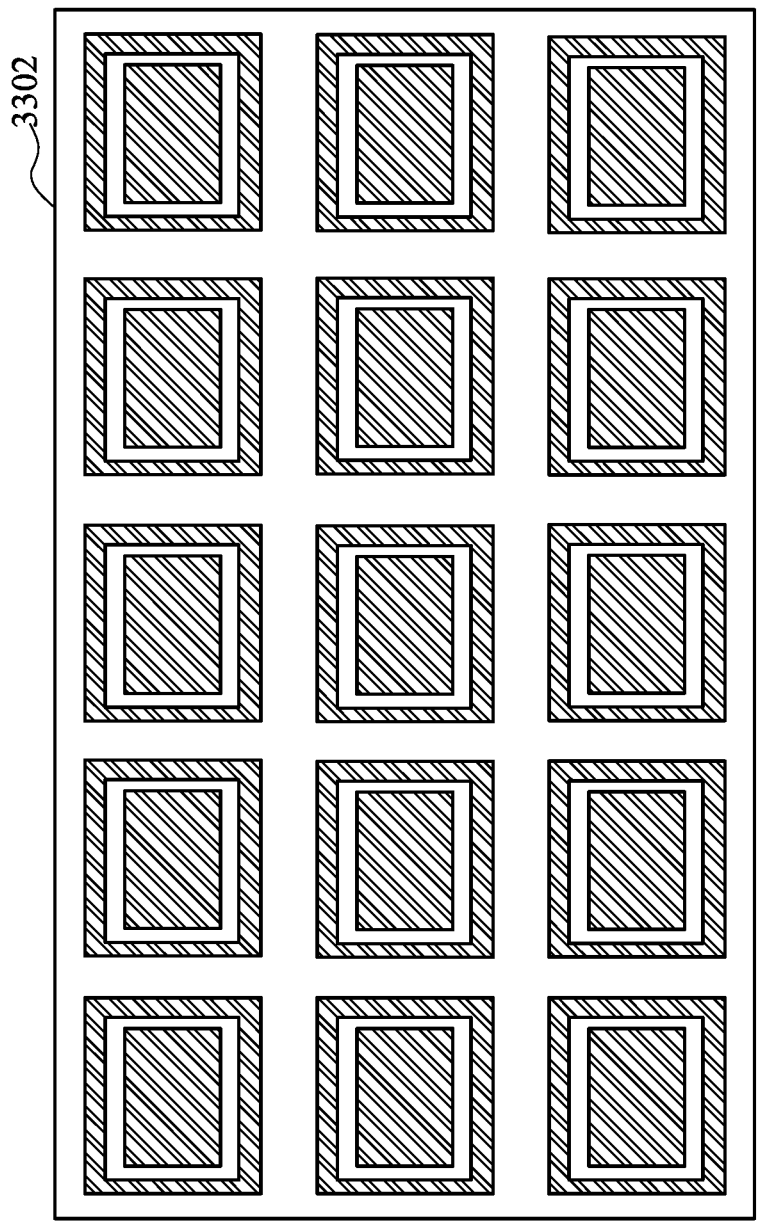
FIG. 33 illustrates a top view of a tray in accordance with various embodiments of the present disclosure.

FIG. 33 illustrates a top view of a tray in accordance with various embodiments of the present disclosure. The tray 3302 comprises a plurality of tray cells arranged in rows and columns. The structure of each tray cell shown in FIG. 33 is similar to that shown in FIG. 32, and hence is not discussed in detail herein. During the formation of the metal shielding layer, a plurality of package-on-package semiconductor devices are placed into their respective tray cells. The metal shielding layer is formed on the plurality of package-on-package semiconductor devices. It should be recognized that while FIG. 33 illustrates the tray 3302 with fifteen tray cells, the tray 3302 could accommodate any number of tray cells.

Figure 34:
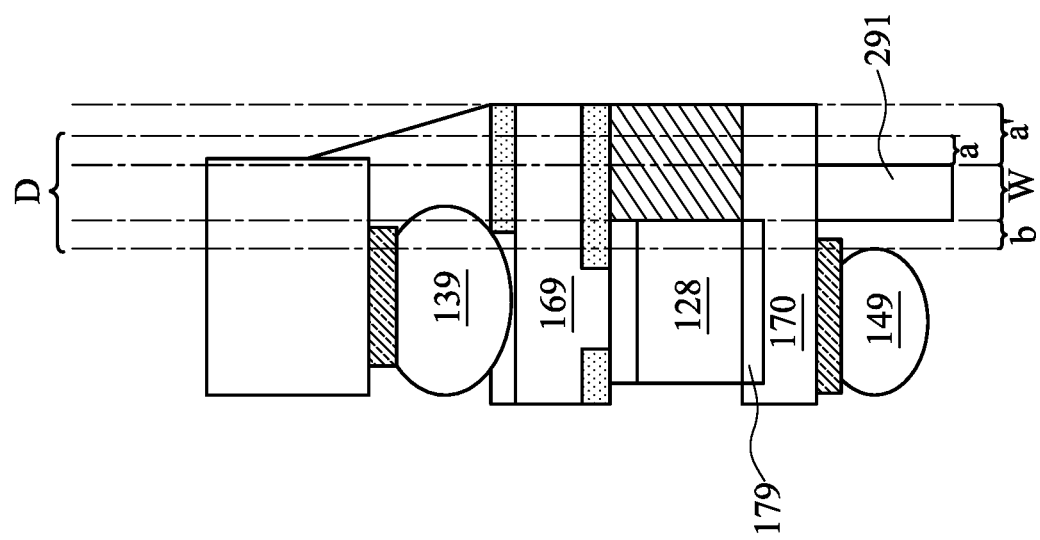
FIG. 34 illustrates a cross sectional view of a portion of the semiconductor device and a portion of the tray in accordance with various embodiments of the present disclosure.

FIG. 34 illustrates a cross sectional view of a portion of the semiconductor device and a portion of the tray in accordance with various embodiments of the present disclosure. The width of the inner wall 291 is defined as W. The distance between bump 149 and the inner wall 291 is defined as b. The front side redistribution line 179 and the dielectric layer 170 form a front side interconnect structure. There may be a seal ring (not shown) formed in the front side interconnect structure. The distance between the seal ring and the inner wall 291 is defined as a; the distance between the edge of the package-on-package semiconductor device and the inner wall 291 is defined as a'. Furthermore, the distance between the bump 149 and the seal ring is defined as D.

In some embodiments, W is in a range from a lower limit to an upper limit. The upper limit of W is approximately equal to D minus 50 um. When D is less than or equal to 400 um, the lower limit of W is equal to 0.5 times D. On the other hand, when D is greater than 400 um, the lower limit of W is equal to D minus 200 um. In order to prevent or, at least, minimize metal burr formation, a is greater than or equal to b. When a is equal to b, a' should be greater than or equal to b. As shown in FIG. 34, by adjusting the location of the inner wall 291, the width of the metal shielding layer underneath the dielectric layer 170 may vary accordingly. From the seal ring, the max width of the metal shielding layer underneath the dielectric layer 170 is equal to the sum of a and b.

Figure 35:
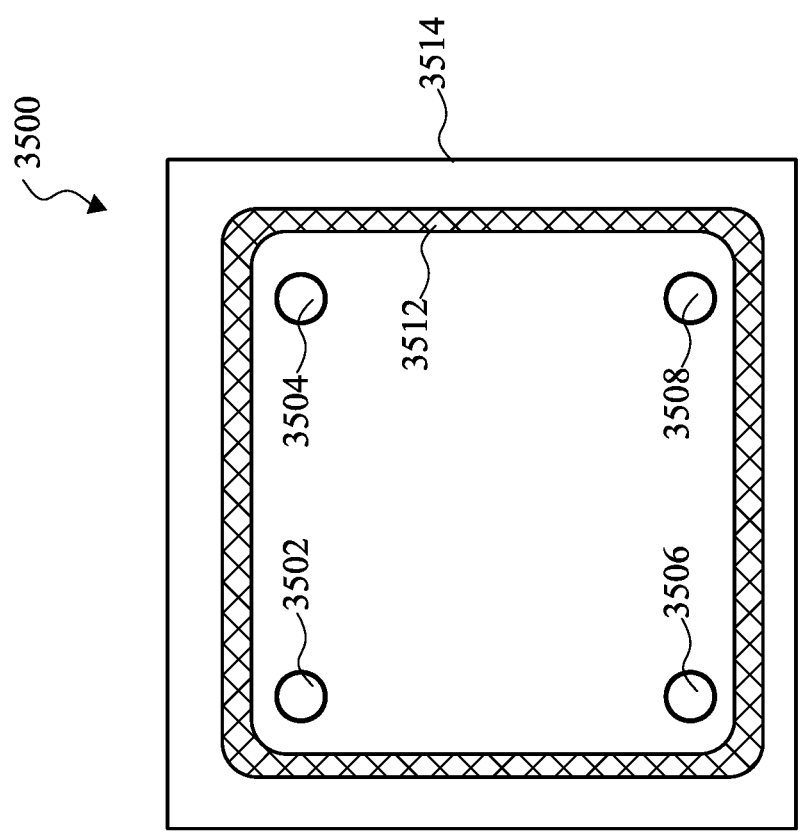
FIG. 35 illustrates a top view of a tray in accordance with various embodiments of the present disclosure.

FIG. 35 illustrates a top view of a tray in accordance with various embodiments of the present disclosure. Inner wall 3512 of the tray 3500 has a substantially uniform width. The width of the inner wall 3512 is similar to that shown in FIGS. 32 and 34, and hence is not discussed again. Bumps 3502, 3504, 3506 and 3508 are within the inner wall 3512. The edge 3514 of the semiconductor device is outside the inner wall 3512.

Figure 36:
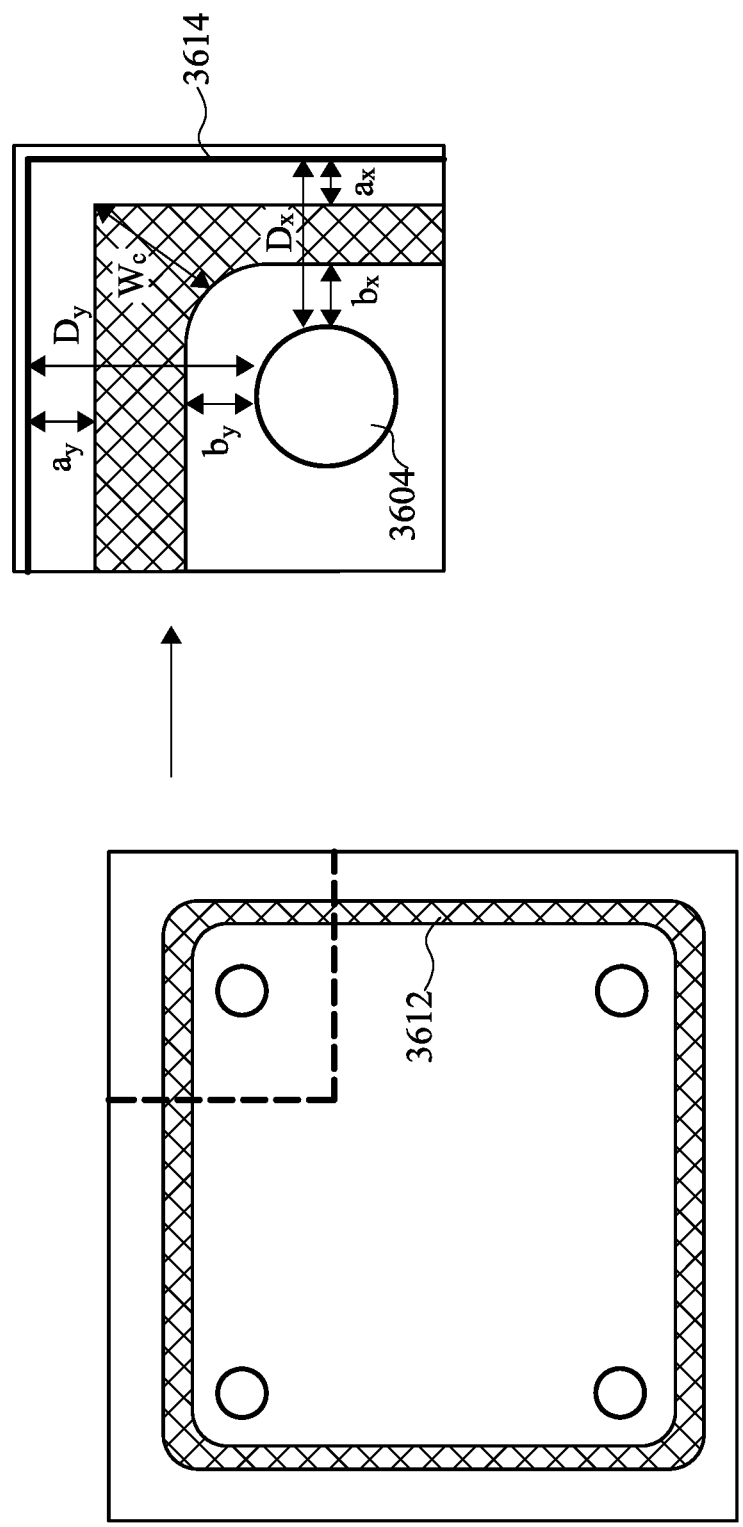
FIG. 36 illustrates a top view of another tray in accordance with various embodiments of the present disclosure.

FIG. 36 illustrates a top view of another tray in accordance with various embodiments of the present disclosure. The inner wall 3612 is similar to the inner wall 3512 except that the inner wall 3612 has four square corners rather than round corners. The figure on the right shows enlarged details of a portion of the tray as indicated by the dashed box.

The horizontal distance between the bump 3604 and the inner wall 3612 is defined as bx; the horizontal distance between the inner wall 3612 and the edge of the package-on-package semiconductor device is defined as ax; the horizontal distance between the bump 3604 and the edge of the package-on-package semiconductor device is defined as Dx; the vertical distance between the bump 3604 and the inner wall 3612 is defined as by; the vertical distance between the inner wall 3612 and the edge of the package-on-package semiconductor device is defined as ay; the horizontal distance between the bump 3604 and the edge of the package-on-package semiconductor device is defined as Dy. The width of the corner is defined as Wc. Wc can be expressed by the following equation:

$$W_c = \sqrt{D_x^2 + D_y^2} - \sqrt{a_x^2 + a_y^2} - \min\{b_x, b_y\} \quad (1)$$

One advantageous feature of having the width of the corner in Equation (1) is that the square corner having a width defined by Equation (1) helps to improve the reliability of the package-on-package semiconductor device. More particularly, the square corners shown in FIG. 36 help to prevent a short circuit between the metal shielding layer and its adjacent bumps.

In accordance with an embodiment, an apparatus comprises a semiconductor structure comprising a top package over a bottom package, wherein the bottom package comprises a first interconnect structure, a second interconnect structure, a molding compound layer between the first interconnect structure and the second interconnect structure, and a semiconductor die in the molding compound layer, and wherein a contact metal of the semiconductor structure is formed in a dielectric layer and the contact metal has an edge substantially level with a surface of the dielectric layer and a metal shielding layer on a top surface, sidewalls of the top package and portions of the bottom package, wherein the metal shielding layer is in direct contact with the edge of the contact metal.

In accordance with an embodiment, a device comprises a semiconductor structure comprising a top package stacked on a bottom package, wherein the bottom package comprises a plurality of bottom package bumps on a bottom surface of the bottom package, a front side contact metal, a molding compound layer and a backside contact metal, and wherein the front side contact metal is between the plurality of bottom package bumps and the molding compound layer and a metal shielding layer on a top surface, sidewalls of the semiconductor structure and portions of a bottom surface of the bottom package, wherein the metal shielding layer is in direct contact with an edge of at least one of the front side contact metal and the backside contact metal.

In accordance with an embodiment, a device comprises a package-on-package structure comprising a top package on a bottom package, wherein the bottom package comprises a plurality of bottom package bumps on a bottom surface of the bottom package, a front side redistribution line, a molding compound layer and a backside redistribution line, and wherein the front side redistribution line is between the plurality of bottom package bumps and the molding compound layer and a metal shielding layer on a top surface, sidewalls of the top package and portions of the bottom package, wherein the metal shielding layer is in direct contact with an edge of at least one of the front side redistribution line and the backside redistribution line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
a semiconductor structure comprising a top package over a bottom package, wherein the bottom package comprises a first interconnect structure, a second interconnect structure, a molding compound layer between the first interconnect structure and the second interconnect structure, and a semiconductor die in the molding compound layer, and wherein a contact metal of the semiconductor structure is formed in a dielectric layer of the first interconnect structure or the second interconnect structure, wherein the contact metal has an edge substantially level with a surface of the dielectric layer, wherein each of the first interconnect structure and the second interconnect structure comprises a plurality of redistribution lines; and
a metal shielding layer on a top surface of the top package, sidewalls of the top package, sidewalls of the bottom package, and a bottom surface of the bottom package, wherein the metal shielding layer is in direct contact with the edge of the contact metal, wherein the metal shielding layer is a single continuous layer, wherein a thickness of the metal shielding layer along the sidewalls of the top package is greater than a thickness of the metal shielding layer along the bottom surface of the bottom package, wherein the metal shielding layer is a distinct layer from the first interconnect structure and the second interconnect structure.

2. The apparatus of claim 1, wherein:
a substrate portion of the semiconductor die is in contact with the first interconnect structure;
an interconnect portion of the semiconductor die is in contact with the second interconnect structure; and
bumps of the top package are in contact with the first interconnect structure.

3. The apparatus of claim 2, wherein:
the contact metal is a first redistribution line of the first interconnect structure.

4. The apparatus of claim 2, wherein:
the contact metal is a first redistribution line of the second interconnect structure.

5. The apparatus of claim 2, wherein:
the metal shielding layer is in contact with sidewalls and a top surface of a redistribution line of the first interconnect structure.

6. The apparatus of claim 2, wherein:
the contact metal is a via connected to a redistribution line of the second interconnect structure.

7. The apparatus of claim 1 further comprising a plurality of through vias extending through the molding compound layer to electrically couple the first interconnect structure to the second interconnect structure.

8. The apparatus of claim 1 further comprising a plurality of package bumps on the bottom surface of the bottom package.

9. A device comprising:
a semiconductor structure comprising a package-on-package structure, the package-on-package structure comprising a top package stacked on a bottom package, wherein the bottom package comprises a plurality of bottom package bumps on a bottom surface of the bottom package, a front side contact metal, a molding compound layer and a backside contact metal, and wherein the front side contact metal is between the plurality of bottom package bumps and the molding compound layer, wherein the front side contact metal is a front side redistribution line, and wherein the backside contact metal is a backside redistribution line; and
a metal shielding layer being a single continuous layer extending from a top surface of the top package along sidewalls of the semiconductor structure to a bottom surface of the bottom package, wherein the metal shielding layer is in direct contact with an edge of at least one of the front side contact metal and the backside contact metal, wherein a thickness of the metal shielding layer over sidewalls of the package-on-package structure is greater than a thickness of the metal shielding layer over the bottom surface of the bottom package.

10. The device of claim 9, further comprising:
a semiconductor die embedded in the molding compound layer, wherein an interconnect portion of the semiconductor die is in direct contact with the front side redistribution line.

11. The device of claim 9, wherein:
the metal shielding layer is in direct contact with an edge of the backside redistribution line.

12. The device of claim 9, wherein:
the metal shielding layer is in direct contact with an edge of the front side redistribution line.

13. The device of claim 9, wherein:
the metal shielding layer is connected to the front side redistribution line through a via formed on the front side redistribution line.

14. The device of claim 9, wherein:
the metal shielding layer over the bottom surface of the bottom package occupies edge portions of the bottom surface of the bottom package.

15. The device of claim 9, wherein the metal shielding layer contacts an upper surface of the bottom package.

16. The device of claim 9, wherein the metal shielding layer contacts a bottom surface of the bottom package.

17. A device comprising: a package-on-package structure comprising a top package on a bottom package, wherein the bottom package comprises a plurality of bottom package bumps on a bottom surface of the bottom package, a front side redistribution line, a molding compound layer and a backside redistribution line, and wherein the front side redistribution line is between the plurality of bottom package bumps and the molding compound layer, the package-on-package structure comprising a semiconductor die embedded in the molding compound layer, wherein an interconnect portion of the semiconductor die is in direct contact with the front side redistribution line, the package-on-package structure comprising a first via and a second via, the first via extending through the molding compound layer and coupled between the front side redistribution line and the backside redistribution line, the second via extending through the molding compound layer and coupled between the front side redistribution line and the backside redistribution line, wherein the semiconductor die is between the first via and the second via; and a metal shielding layer in direct contact with a top surface of the top package, sidewalls of the top package and portions of the bottom package, wherein the metal shielding layer is a single continuous layer in direct contact with an edge of at least one of the front side redistribution line and the backside redistribution line; wherein a thickness of the metal shielding layer over sidewalls of the package-on-package structure is greater than a thickness of the metal shielding layer over the bottom surface of the bottom package.

18. The device of claim 17, wherein the metal shielding layer contacts an upper surface of the bottom package.

19. The device of claim 17, wherein the metal shielding layer completely is in direct contact with both the front side redistribution line and the backside redistribution line.

20. The device of claim 17, wherein the metal shielding layer is in direct contact with a bottom surface of the bottom package.

* * * * *